(12) United States Patent
Wakaki

(10) Patent No.: US 11,605,766 B2
(45) Date of Patent: Mar. 14, 2023

(54) LIGHT-EMITTING MODULE AND METHOD OF MANUFACTURING LIGHT-EMITTING MODULE

(71) Applicant: NICHIA CORPORATION, Anan (JP)

(72) Inventor: Takayoshi Wakaki, Anan (JP)

(73) Assignee: NICHIA CORPORATION, Anan (JP)

( * ) Notice: Subject to any disclaimer, the term of this patent is extended or adjusted under 35 U.S.C. 154(b) by 118 days.

(21) Appl. No.: 17/135,011

(22) Filed: Dec. 28, 2020

(65) Prior Publication Data

US 2021/0202795 A1 Jul. 1, 2021

(30) Foreign Application Priority Data

Dec. 27, 2019 (JP) .............................. JP2019-238411

(51) Int. Cl.
*H01L 33/60* (2010.01)
*H01L 33/38* (2010.01)
(Continued)

(52) U.S. Cl.
CPC ............ *H01L 33/60* (2013.01); *H01L 33/005* (2013.01); *H01L 33/10* (2013.01); *H01L 33/382* (2013.01);
(Continued)

(58) Field of Classification Search
CPC ..... H01L 33/10; H01L 33/54; H01L 25/0753; H01L 33/60; H01L 33/58; H01L 33/005; H01L 2933/0058
See application file for complete search history.

(56) References Cited

U.S. PATENT DOCUMENTS 6,405,431 B1 * 6/2002 Shin ..................... H05K 3/4652
29/830
2006/0222285 A1 * 10/2006 Minamio .......... H01L 27/14618
385/14
(Continued)

FOREIGN PATENT DOCUMENTS

JP 2003011416 A 1/2003
JP 2013115070 A 6/2013
(Continued)

*Primary Examiner* — Feifei Yeung Lopez
(74) *Attorney, Agent, or Firm* — Hunton Andrews Kurth LLP

(57) ABSTRACT

A light-emitting module includes: a light-transmitting light-guide plate; light sources disposed on the lightguide plate, each light source including a light-emitting element and a cover member including a first resin and provided beside a lateral surface of the light-emitting element, with first and second electrodes exposed through the cover member; a light-reflecting member provided on the lightguide plate and provided around the light sources, with the cover members of exposed through the light-reflecting member, wherein the light-reflecting member includes a second resin having a higher hardness than the first resin; a support layer covering the light-reflecting member and the cover members, with the first electrodes and the second electrodes exposed through the support layer, wherein the support layer includes a third resin having a higher hardness than the first resin; and a wiring layer provided on the support layer and connected to the first electrodes and the second electrodes.

18 Claims, 13 Drawing Sheets

(51) Int. Cl.
   *H01L 33/56*   (2010.01)
   *H01L 33/62*   (2010.01)
   *H01L 33/00*   (2010.01)
   *H01L 33/10*   (2010.01)
   *H01L 33/54*   (2010.01)

(52) U.S. Cl.
   CPC .............. *H01L 33/54* (2013.01); *H01L 33/56* (2013.01); *H01L 33/62* (2013.01); *H01L 2933/005* (2013.01); *H01L 2933/0016* (2013.01); *H01L 2933/0058* (2013.01); *H01L 2933/0066* (2013.01)

(56) References Cited

U.S. PATENT DOCUMENTS

| | | | |
|---|---|---|---|
| 2007/0121340 A1* | 5/2007 | Hoshi | G02B 6/0021 362/600 |
| 2014/0048824 A1 | 2/2014 | Hsieh | |
| 2018/0239193 A1 | 8/2018 | Hayashi | |
| 2018/0331263 A1* | 11/2018 | Ikeda | H01L 33/60 |
| 2020/0105973 A1* | 4/2020 | Kasai | G02F 1/133603 |
| 2020/0209458 A1* | 7/2020 | Yuu | H01L 33/62 |
| 2020/0209461 A1* | 7/2020 | Achi | G02B 6/0045 |
| 2020/0209462 A1* | 7/2020 | Kasai | G02F 1/133608 |
| 2020/0243711 A1* | 7/2020 | Sato | H01L 33/0095 |

FOREIGN PATENT DOCUMENTS

| | | |
|---|---|---|
| JP | 2013145852 A | 7/2013 |
| JP | 2014003176 A | 1/2014 |
| JP | 2015525001 A | 8/2015 |
| JP | 2018133304 A | 8/2018 |

\* cited by examiner

LIGHT-EMITTING MODULE AND METHOD OF MANUFACTURING LIGHT-EMITTING MODULE

CROSS-REFERENCE TO RELATED APPLICATION

This application claims priority to Japanese Patent Application No. 2019-238411, filed on Dec. 27, 2019, the disclosure of which is hereby incorporated by reference in its entirety.

BACKGROUND

The present disclosure relates to a light-emitting module and a method of manufacturing a light-emitting module.

Light-emitting modules using light-emitting elements such as light-emitting diodes are widely used as backlights of displays such as liquid crystal display devices. Particularly, direct-type backlights are used in order to increase the brightness of the display or to increase the image contrast by partial driving.

For some applications, there is a demand for decreasing the thickness of a display including a direct-type backlight as much as possible, and thus there is also a demand for decreasing the thickness of a direct-type backlight as much as possible. For example, Japanese Patent Publication No. 2018-133304 discloses a light-emitting module in which a lens for diffusing light is provided on a light-transmitting substrate, with a plurality of light-emitting elements attached to the substrate. By disposing a plurality of light-emitting modules having such a configuration, it is possible to realize a thin backlight.

SUMMARY

With a light-emitting module including a plurality of light-emitting elements attached to a lightguide plate, it may be preferred to also include wires for electrically connecting together the plurality of light-emitting elements. The present disclosure provides a thin light-emitting module including a wiring layer for connecting together a plurality of light-emitting elements.

A light-emitting module according to an embodiment of the present disclosure includes:

a lightguide plate configured to be light transmissive, a plurality of light sources disposed on the lightguide plate, a light-reflecting member, a support layer, and a wiring layer. The light sources each has an emission surface located closer to the lightguide plate, an electrode surface located on an opposite side from the emission surface, and a lateral surface. The plurality of light sources each includes a light-emitting element including a first electrode and a second electrode located on the electrode surface, and a cover member including a first resin. The cover member is provided beside a lateral surface of the light-emitting element while the first electrode and the second electrode are exposed through the cover member. The light-reflecting member is provided on the lightguide plate and provided around the light sources while the cover members of the light sources are exposed through the light-reflecting member. The light-reflecting member includes a second resin having a higher hardness than a hardness of the first resin. The support layer covers the light-reflecting member and the cover members of the light sources while the first electrodes and the second electrodes of the light sources are exposed through the support layer. The support layer includes a third resin having a higher hardness than a hardness of the first resin. The wiring layer is provided on the support layer and connected to the first electrodes and the second electrodes of the light sources.

A method of manufacturing a light-emitting module, the method including: disposing a plurality of light sources, providing a light-reflecting member, forming a support layer, exposing a first and a second electrode, and forming a wiring layer. In the step of disposing the light sources, the light sources are disposed on a first primary surface of a light-transmitting lightguide plate located on an opposite side from the first primary surface of the lightguide plate. Each of the light sources has an emission surface facing the lightguide plate, an electrode surface located on an opposite side from the emission surface, and a lateral surface. Each of the light sources includes a light-emitting element including a first electrode and a second electrode located on the electrode surface, and a cover member including a first resin and provided beside a lateral surface of the light-emitting element while the first electrode and the second electrode are exposed through the cover member. In the step of providing the light-reflecting member, the light-reflecting member is provided around the light sources on the first primary surface of the lightguide plate while the first electrodes, the second electrodes and the cover members of the light sources are exposed through the light-reflecting member. The light-reflecting member includes a second resin having a higher hardness than a hardness of the first resin. In the step of forming a support layer, the support layer is formed on the light-reflecting member, the cover members, the first electrodes and the second electrodes. The support layer includes a third resin having a higher hardness than the first resin. In the step of exposing the first electrodes and the second electrodes, the first electrodes and the second electrodes of the light sources are exposed by removing a portion of the support layer. In the step of forming the wiring layer, the wiring layer is formed on the support layer, the first electrodes and the second electrodes of the light sources.

According to an embodiment of the present disclosure, a thin light-emitting module including a wiring layer for connecting together a plurality of light-emitting elements can be provided.

DETAILED DESCRIPTION

Embodiments of the present disclosure will now be described in detail with reference to the drawings. The following embodiments are illustrative, and a light-emitting module and a method of manufacturing a light-emitting module of the present disclosure are not limited thereto. For example, the numerical values, shapes, materials, steps, and the order of steps, etc., to be shown in the following embodiments are merely examples, and various modifications can be made thereto as long as they do not lead to technical contradictions. The embodiments to be described below are merely illustrative, and various combinations are possible as long as they do not lead to technical contradictions.

The size, the shape, etc., of the components shown in the figures may be exaggerated for the ease of understanding, and they may not represent the size and the shape of the components, the size relationship therebetween in an actual light-emitting module. Some components may be omitted in order to prevent the figures from becoming overly complicated.

In the following description, components of like functions may be denoted by like reference signs and may not be described redundantly. Terms indicating specific directions and positions (e.g., "upper", "lower", "right", "left", and other terms including such terms) may be used in the following description. However, these terms are used merely for the ease of understanding relative directions or positions in the figure being referred to. The arrangement of components in figures from documents other than the present disclosure, actual products, actual manufacturing apparatuses, etc., does not need to be equal to that shown in the figure being referred to, as long as it conforms with the directional or positional relationship as indicated by terms such as "upper" and "lower" in the figure being referred to. In the present disclosure, the term "parallel" encompasses cases where two straight lines, sides, planes, etc., are in the range of about 0±5°, unless otherwise specified. In the present disclosure, the term "perpendicular" or "orthogonal" encompasses cases where two straight lines, sides, planes, etc., are in the range of about 90±5°, unless otherwise specified.

(Structure of Light-Emitting Module 201)

Figure 1A:
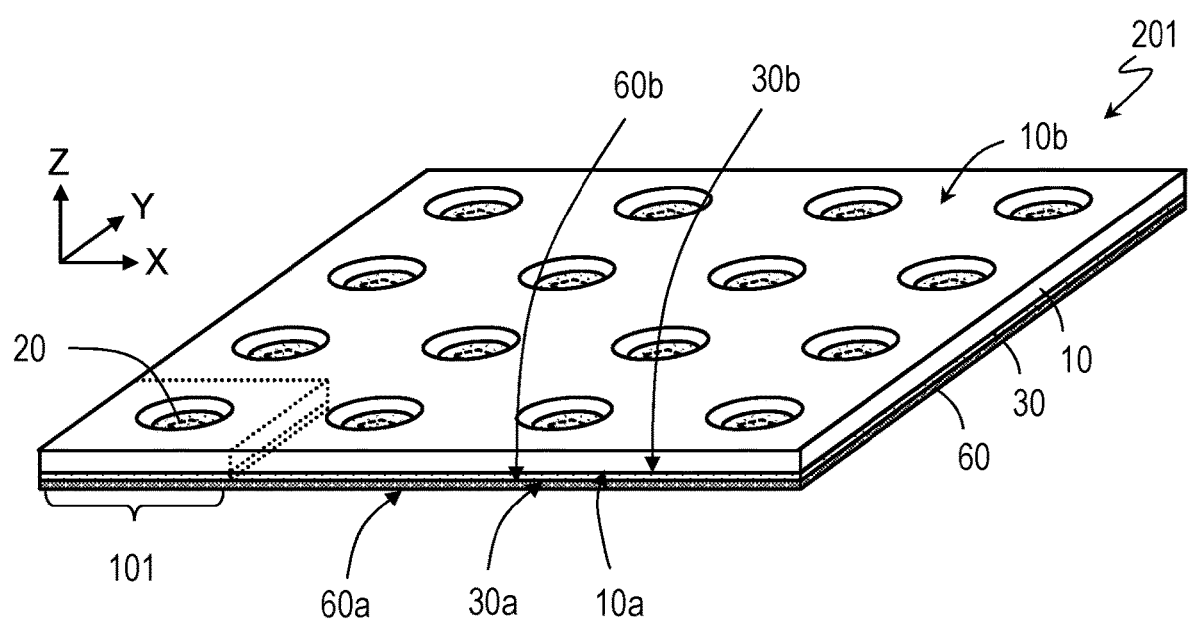
FIG. 1A is a perspective view showing a light-emitting module according to one embodiment.
Figure 1B:
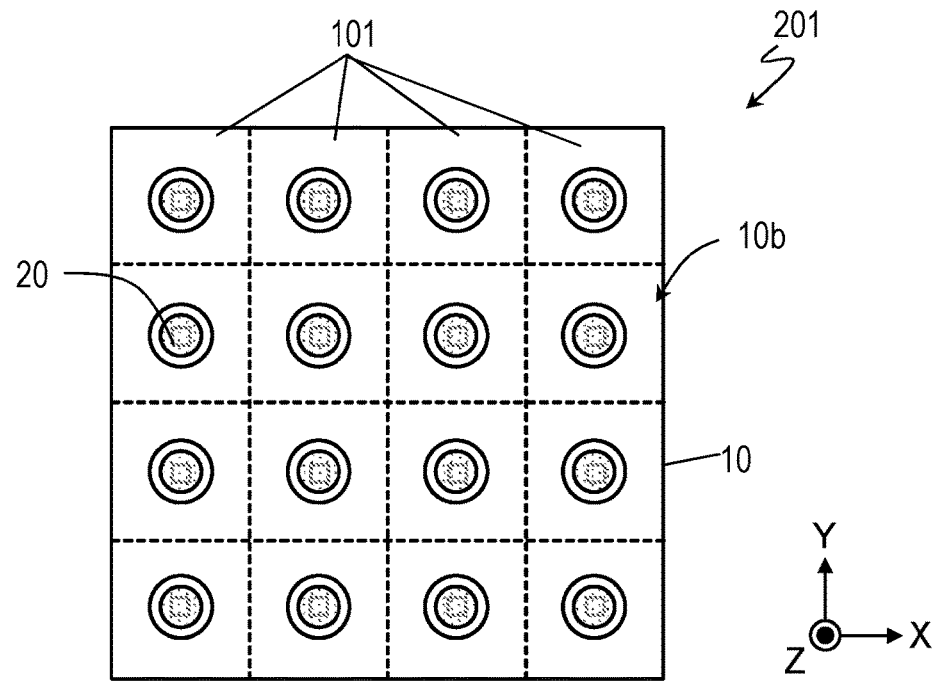
FIG. 1B is a top view showing the light-emitting module of FIG. 1A.
Figure 1C:
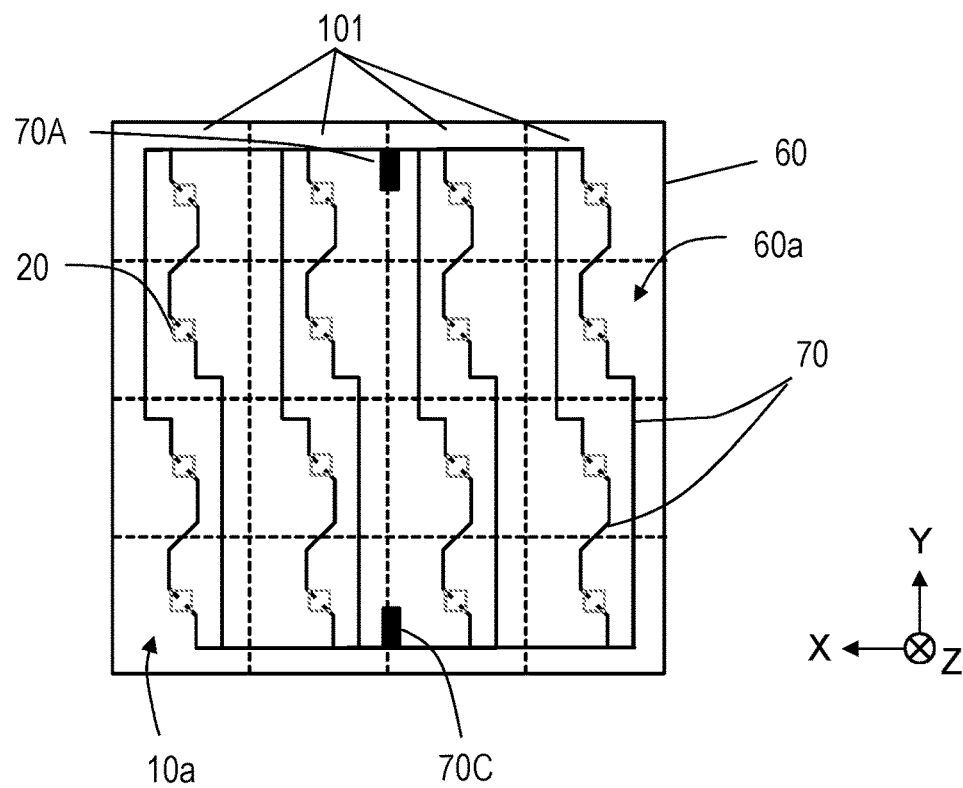
FIG. 1C is a bottom view showing the light-emitting module of FIG. 1A.

FIG. 1A is a perspective view showing a light-emitting module 201, which is one embodiment of the light-emitting module of the present disclosure. FIG. 1B and FIG. 1C are a top view and a bottom view of the light-emitting module 201. The light-emitting module 201 has a plate shape as a whole. The light-emitting module 201 includes a lightguide plate 10, a plurality of light sources 20, a light-reflecting member 30, a support layer 60 and a wiring layer 70. FIG. 1A also shows arrows in the X direction, the Y direction and the Z direction, which are orthogonal to each other, for the purpose of illustration. Arrows indicating these directions may be also shown in other figures of the present disclosure. The X direction and the Y direction are also respectively the first direction and the second direction. In the illustrated example, the light-emitting module 201 includes a plurality of light sources that are arranged in a two-dimensional array extending in the X direction and the Y direction. That is, the light-emitting module 201 includes a plurality of light-emitting modules 101 each including one light source.

Figure 2A:
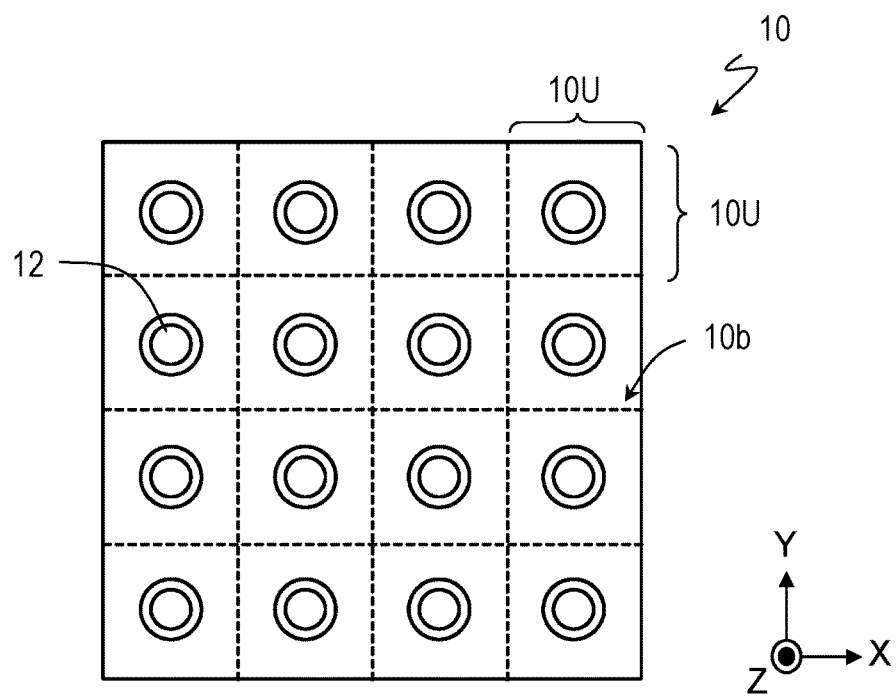
FIG. 2A is a top view showing a lightguide plate of the light-emitting module of FIG. 1A.
Figure 2B:
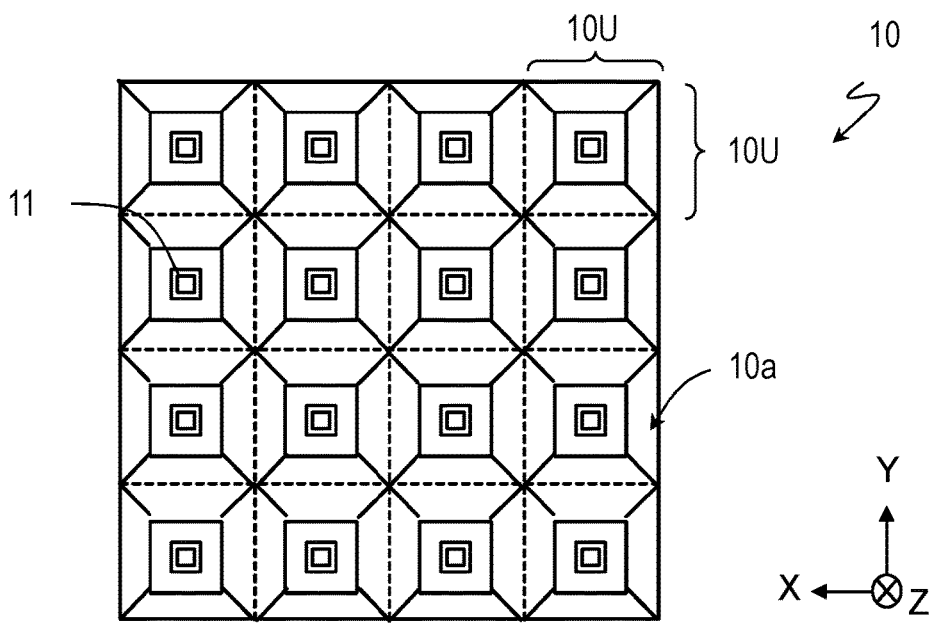
FIG. 2B is a bottom view showing the lightguide plate of the light-emitting module of FIG. 1A.
Figure 2C:
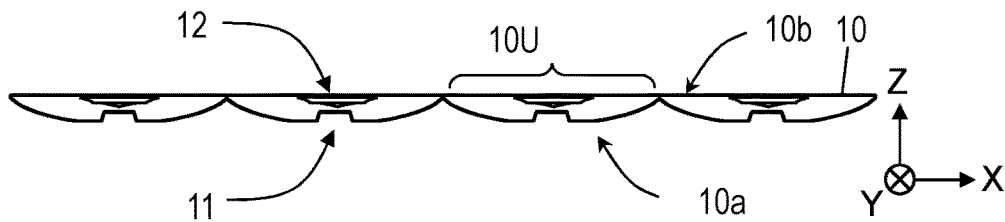
FIG. 2C is a cross-sectional view showing the lightguide plate of the light-emitting module of FIG. 1A.

FIG. 2A, FIG. 2B and FIG. 2C respectively show a top view, a bottom view and a cross-sectional view of the lightguide plate 10. The lightguide plate 10 has a first primary surface 10a and a second primary surface 10b, which is located on the opposite side from the first primary surface 10a, and has a lightguide structure wherein light emitted from a plurality of light sources 20 that are disposed in a plurality of first recesses 11 formed in the first primary surface 10a is output from the second primary surface 10b. The light-reflecting member 30 is located on a surface closer to the first primary surface 10a of the lightguide plate 10, and reflects the light emitted from the light sources 20 at the first primary surface 10a. The second primary surface 10b of the lightguide plate 10 serves as the light-emitting surface of the light-emitting module 201. The second primary surface 10b of the lightguide plate 10 can have a rectangular shape as a typical example. In the present disclosure, the X direction and the Y direction described above respectively coincide with one side and another side, which are orthogonal to each other, of the rectangular shape of the lightguide plate 10. The length of one side of the rectangular shape of the second primary surface 10b is in the range of 1 cm or more and 200 cm or less, for example. In a typical embodiment of the present disclosure, one side of the rectangular shape of the second primary surface 10b of the lightguide plate 10 has a length of 10 mm or more and 30 mm or less. The vertical length and the horizontal length of the rectangular shape of the second primary surface 10b can respectively be about 24.3 mm and about 21.5 mm, for example.

As shown in FIG. 1A, the light-reflecting member 30 has a first primary surface 30a and a second primary surface 30b. The second primary surface 30b faces the first primary surface 10a of the lightguide plate 10. The support layer 60 is located on a side closer to the first primary surface 30a. The support layer 60 has a first primary surface 60a and a second primary surface 60b. The second primary surface 60b faces the first primary surface 30a of the light-reflecting member 30. As shown in FIG. 1C, the wiring layer 70 is provided on the first primary surface 60a. As will be described in detail below, with the wiring layer 70 provided on the support layer 60, when the light-emitting module 201 is mounted on a mounting substrate, it may reduce the possibility of disconnections on the wiring layer 70 due to stress from the mounting substrate.

As shown in FIGS. 2A to 2C, the first primary surface 10a and the second primary surface 10b of the lightguide plate 10 are demarcated into a plurality of module regions 10U, which are arranged in a one-dimensional or two-dimensional array. Each module region 10U is configured as a light-emitting module 101. In this example, the lightguide plate 10 includes sixteen module regions 10U arranged in a two-dimensional array. The sixteen module regions 10U are arranged in four rows by four columns. There is no limitation on the number and arrangement of module regions 10U included in the lightguide plate 10, i.e., the number and arrangement of light-emitting modules 101 included in the light-emitting module 201, which are not limited to those shown in FIG. 1A to FIG. 1C, etc.

(Structure of Light-Emitting Module 101)

Figure 3A:
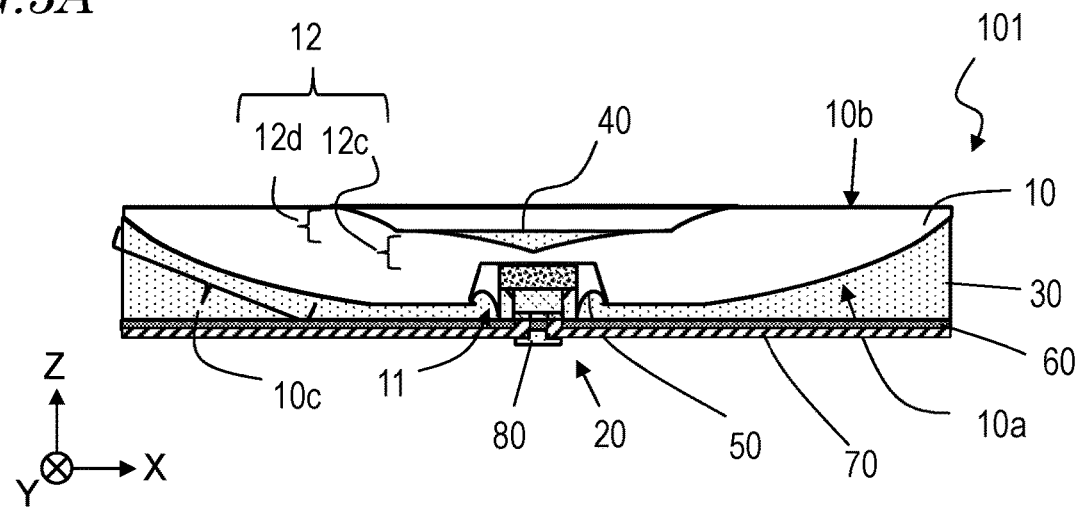
FIG. 3A is a cross-sectional view showing the light-emitting module of FIG. 1A.
Figure 3B:
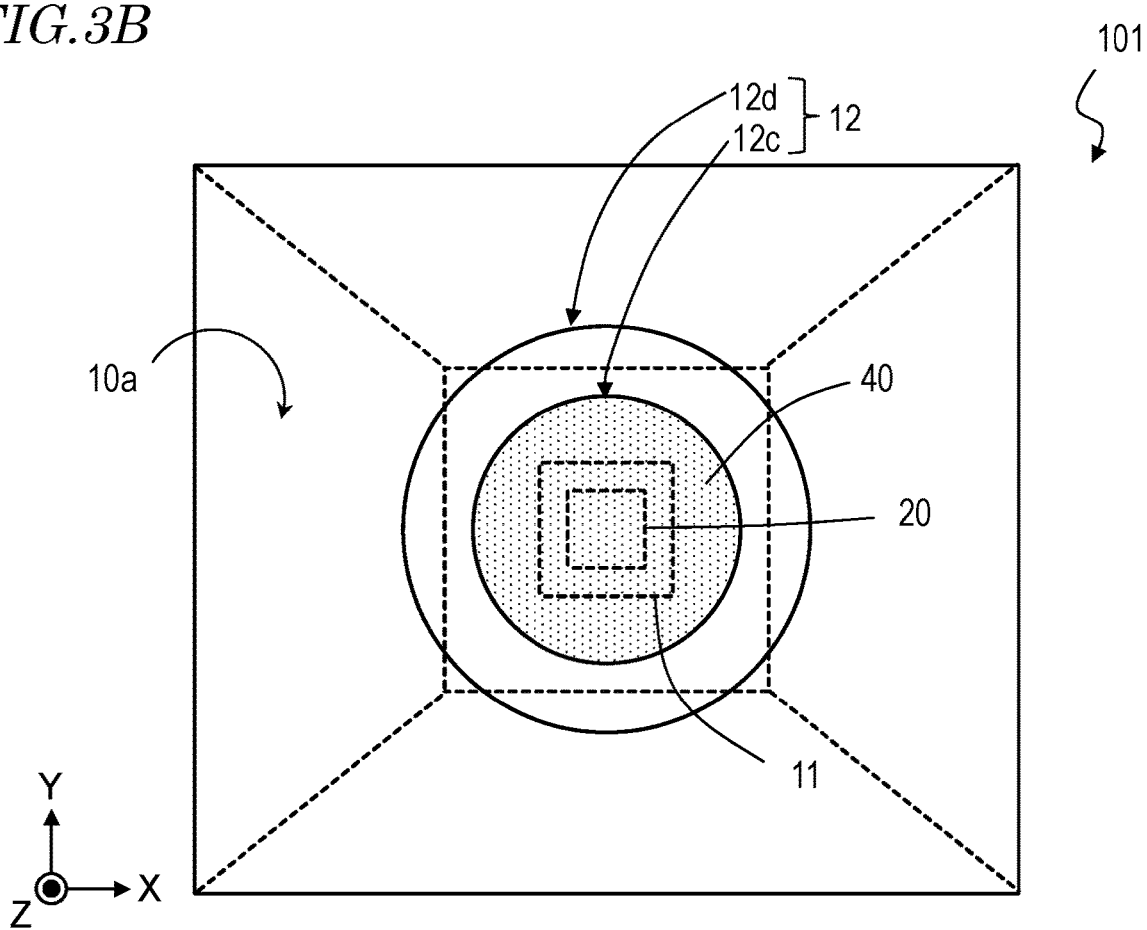
FIG. 3B is a top view showing the light-emitting module of FIG. 1A.
Figure 3C:
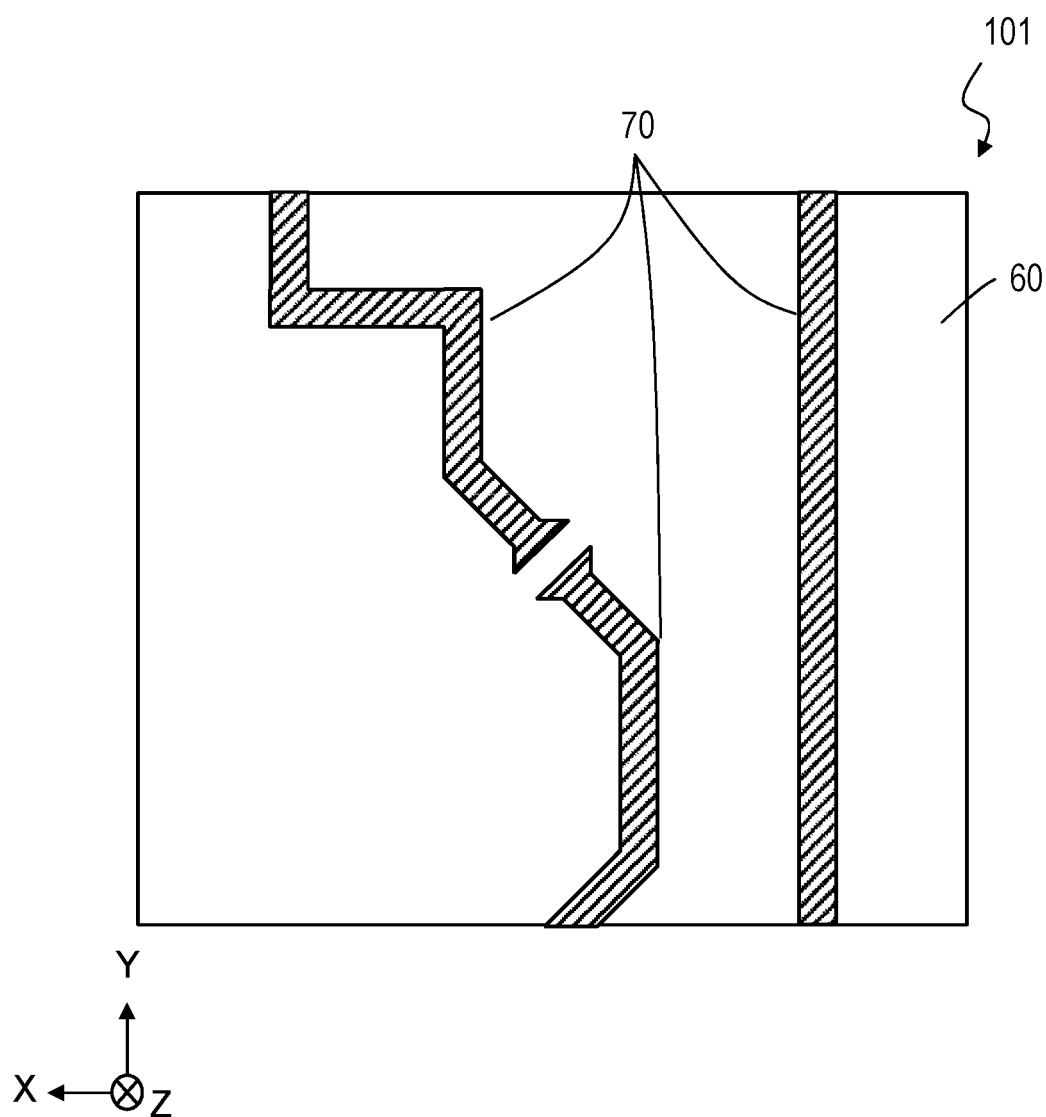
FIG. 3C is a bottom view showing the light-emitting module of FIG. 1A.
Figure 4:
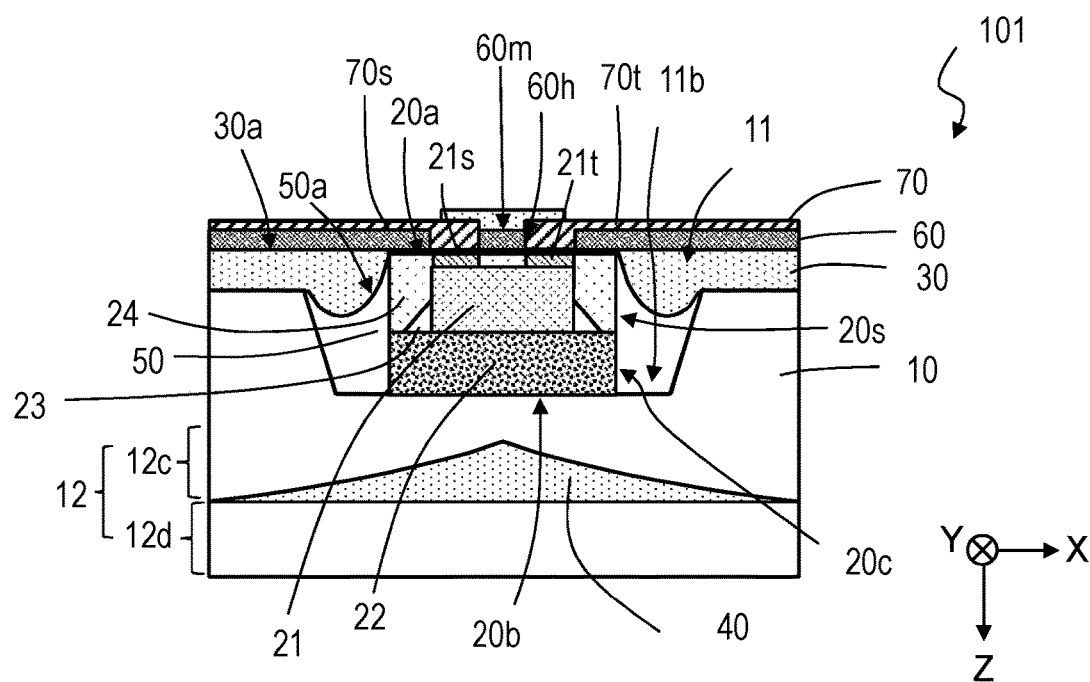
FIG. 4 is a cross-sectional view showing a main part of the light-emitting module of FIG. 3A.

FIG. 3A, FIG. 3B and FIG. 3C respectively show a cross-sectional view, a top view and a bottom view of the light-emitting module 101. FIG. 4 is an enlarged cross-sectional view showing the vicinity of a light source 20 of the light-emitting module 101. The light-emitting module 101 includes the lightguide plate 10, the light source 20, the light-reflecting member 30, the support layer 60 and the wiring layer 70. The light-emitting module 101 can further include a light-reflecting layer 40, a second joining member 50 and an insulative layer 80. The lightguide plate 10, the light-reflecting member 30 and the wiring layer 70 of each light-emitting module 101 are respectively continued to those of adjacent light-emitting modules 101. These members collectively configured as an integral lightguide plate 10, an integral light-reflecting member 30 and an integral wiring layer 70, respectively, of the light-emitting module 201.

[Lightguide Plate 10]

The lightguide plate 10 supports the light source 20. The lightguide plate 10 is light transmissive, and has a lightguide structure with which light emitted from the light sources 20 can exit as uniformly as possible from across the first primary surface side of the lightguide plate 10. Specifically, the lightguide plate 10 has a first primary surface 10a and a second primary surface 10b, which is located on the opposite side from the first primary surface 10a, and the first recess 11 is formed on the first primary surface 10a. As shown in FIG. 3A and FIG. 3B, the first recess 11 has, for example, an inverted quadrangular pyramidal shape of which the opening at the first primary surface 10a is larger than the inner upper surface defining the recess, when seen from the first primary surface 10a. In the present embodiment, the inverted quadrangular pyramidal shape is defined so that the four sides defining the opening and four sides of the inner upper surface defining the recess are substantially parallel to the four sides of the module region 10U. However, the inverted quadrangular pyramidal shape can be defined so that the diagonal lines of the opening and the diagonal lines of the inner upper surface defining the recess are substantially parallel to the four sides of the module region 10U. At least one light source 20 is disposed in the first recess 11.

The first primary surface 10a of the lightguide plate 10 can have a curved surface portion 10c for reflecting light traveling toward the first primary surface 10a. For example, the curved surface portion 10c is provided in the peripheral region of each module region 10U of the first primary surface 10a. With the light-reflecting member 30 disposed on the first primary surface 10a, light that is incident on the first primary surface 10a at a shallow angle is totally reflected at the curved surface portion 10c toward the second primary surface 10b, thereby increasing the light extraction efficiency.

The lightguide plate 10 can include an optically functional part for adjusting the light distribution of light exiting from the second primary surface. Specifically, the optically functional part is a second recess 12 formed on the second primary surface 10b. For example, the second recess 12 is defined by a first portion 12c having an inverted conical shape, and a second portion 12d having an inverted truncated conical shape, when seen from the second primary surface 10b. The tip of the cone shape is located on the inner side of the lightguide plate 10, and the virtual bottom surface defining the inverted truncated conical shape is in contact with the virtual upper surface defining the inverted conical shape. It is preferred that the center of the second recess 12 coincides with the center of the first recess 11 as seen from above, i.e., as seen from the second primary surface 10b or the first primary surface 10a.

The optically functional part of the lightguide plate 10 is not limited to the example described above, and the lightguide plate 10 can include an optically functional part having another shape. The optically functional part controls the light exiting direction utilizing the optical refraction at the boundary between the inner surface and the bottom surface defining the second recess 12 and the external environment. In the present embodiment, the light-reflecting layer 40 is provided in the first portion 12c of the second recess 12.

The lightguide plate 10 can be formed of a thermoplastic resin such as acrylic, polycarbonate, cyclic polyolefin, polyethylene terephthalate or polyester, a thermosetting resin such as epoxy or silicone, or a light-transmitting material such as a glass. For example, the lightguide plate 10 including a plurality of module regions 10U continued to each other in a two-dimensional array can be formed by injection molding using a mold that has a shape corresponding to the first recess 11, the curved surface portion 10c and the second recess 12.

[Light-Reflecting Layer 40]

In the case in which the lightguide plate 10 includes the second recess 12, the light-reflecting layer 40 can be provided in the first portion 12c of the second recess 12. The light-reflecting layer 40 is provided in the first portion 12c of the second recess 12. With the light-reflecting layer 40 provided above the light source 20, a portion of the light emitted from the light source can be reflected toward the first primary surface 10a. The first portion 12c has a cone shape, and therefore the light reflected at the interface between the lightguide plate 10 and the light-reflecting layer 40 is further diffused and travels toward the first primary surface 10a. Therefore, light from the light source 20 can be more efficiently diffused across the surface of the lightguide plate 10. The light-reflecting layer 40 is provided so as to face the light source 20, and therefore it is possible to suppress the brightness on the second primary surface 10b of the lightguide plate 10 from being significantly higher directly above the light source 20 than in other regions. The light-reflecting layer 40 is formed selectively inside the first portion 12c of the second recess 12, and therefore unnecessary decrease of the brightness directly above the light source 20 can be avoided. As a result, it is possible to realize light with improved brightness uniformity while reducing the overall thickness of the light-emitting module 101.

The light-reflecting layer 40 is formed from a light-reflecting material such as a resin material in which a light-reflecting filler is dispersed therein, for example. The term "light reflection" or "light-reflecting" as used herein means that the reflectivity is 60% or more at the emission peak wavelength of the light source 20. The reflectivity of the light-reflecting layer 40 with respect to the emission peak wavelength of the light source 20 is preferably 70% or more, and more preferably 80% or more.

Examples of resin material as a base material used for forming the light-reflecting layer 40 include a silicone resin, a phenolic resin, an epoxy resin, a BT resin, a polyphthal-amide (PPA), etc. Examples of the light-reflecting filler include metal particles, and particles of an inorganic material or an organic material having a higher refractive index than that of the base material. Examples of the light-reflecting filler include particles of titanium dioxide, silicon oxide, zirconium dioxide, potassium titanate, aluminum oxide, aluminum nitride, boron nitride, mullite, niobium oxide, barium sulfate, or particles of various rare earth oxides such as yttrium oxide and gadolinium oxide. It is preferred that the light-reflecting layer 40 is white.

The distribution of the light-reflecting filler in the light-reflecting layer 40 can be substantially constant, or can have a locally high density or a gradient, in the light-reflecting layer 40. For example, the filler can be settled or separated from the base material before the base material cures in the step of forming the light-reflecting layer 40, thereby creating a deviation in the distribution of the light-reflecting filler in the light-reflecting layer 40.

The number density of the filler, which is defined as the number of filler particles per unit area as seen from above, is preferably higher at vicinity of the center of the light-reflecting layer 40 than the number density at vicinity of the outer edge of the light-reflecting layer 40. This can suppress the brightness in the region directly above the light source 20 from being locally significantly high.

[Light Source 20]

Figure 5A:
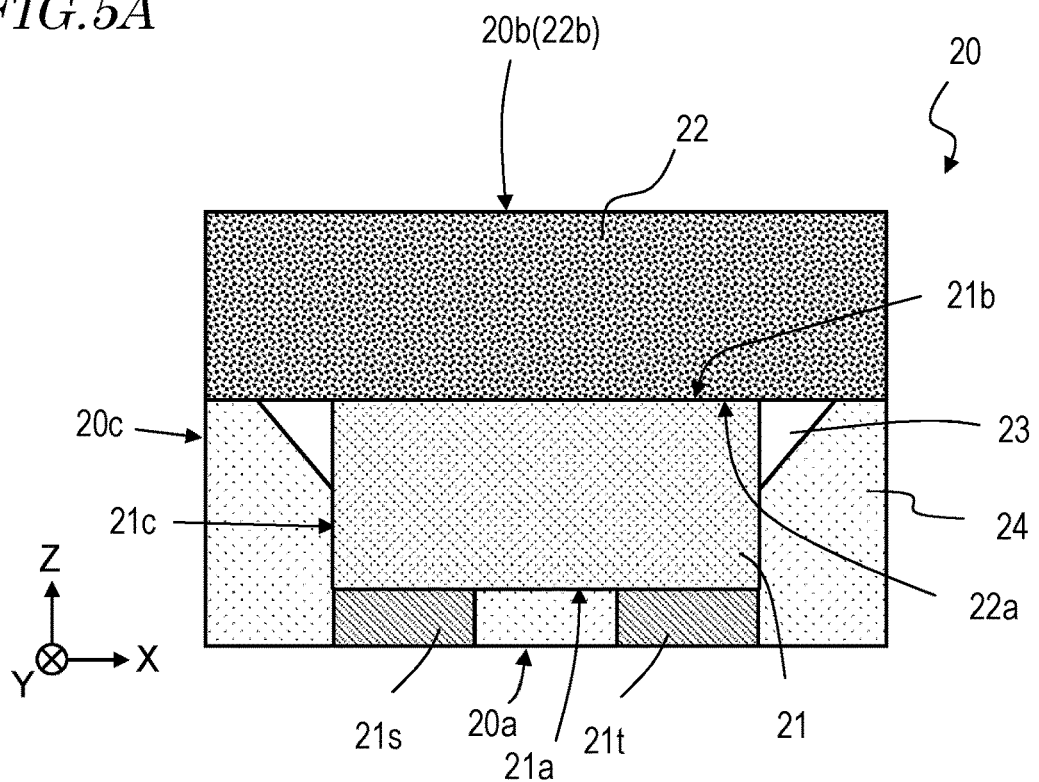
FIG. 5A is a cross-sectional view showing a light source of the light-emitting module of FIG. 1A.
Figure 5B:
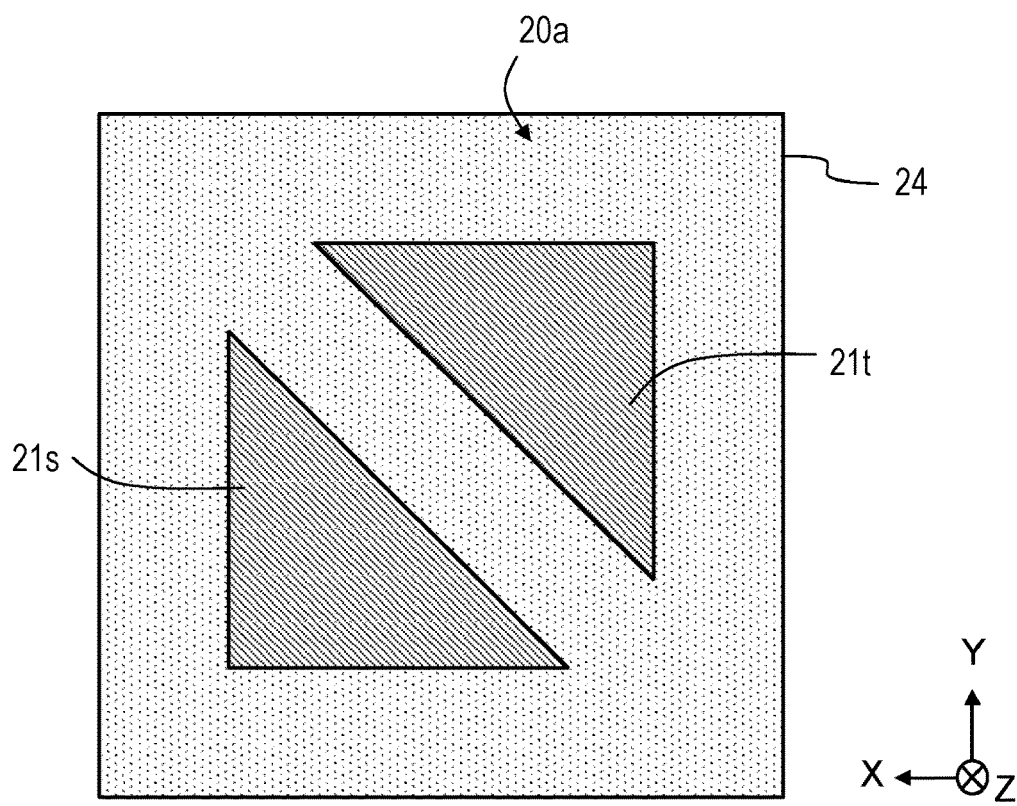
FIG. 5B is a bottom view showing the light source of the light-emitting module of FIG. 1A.
Figure 6:
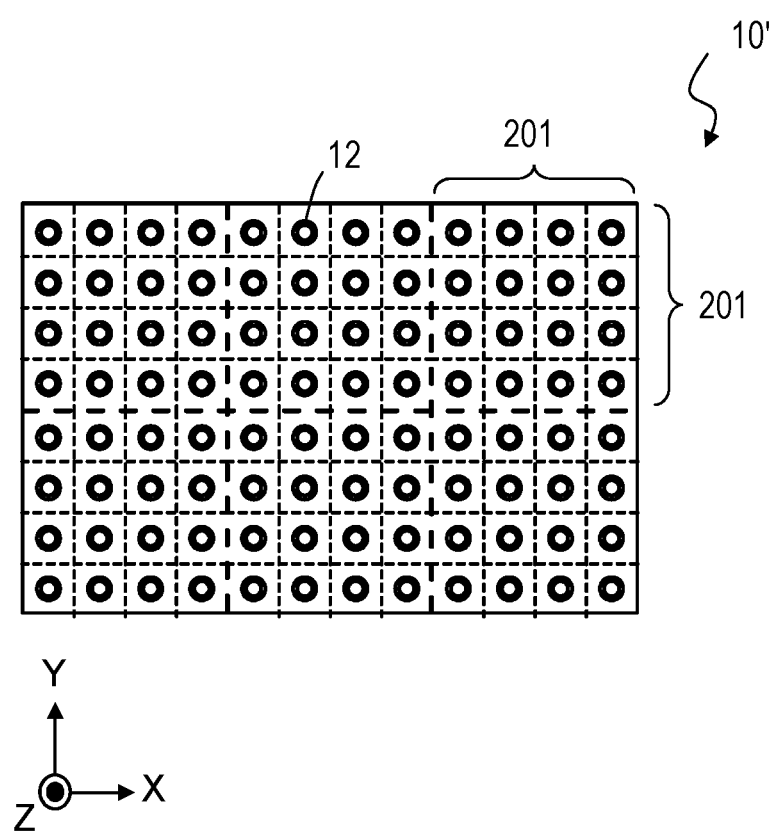
FIG. 6 is a top view showing a lightguide plate used in a method of manufacturing a light-emitting module according to one embodiment.

FIG. 5A and FIG. 5B are a cross-sectional view and a bottom view, respectively, showing the light source 20. At least one light source 20 is disposed in the first recess 11 of the lightguide plate 10. In the present embodiment, the light source 20 includes a light-emitting element 21, a light-transmitting member 22, a first joining member 23 and a cover member 24. For example, the light source 20 as a whole has a rectangular parallelepiped shape that is defined by an electrode surface 20a, an emitting surface 20b and four lateral surfaces 20c.

A typical example of the light-emitting element 21 includes an LED. For example, the light-emitting element 21 includes a support lightguide plate formed of sapphire or gallium nitride, etc., and a semiconductor layered body on the support lightguide plate. The semiconductor layered body includes an n-type semiconductor layer, a p-type semiconductor layer, an active layer sandwiched therebetween, and a first electrode 21s and a second electrode 21t respectively electrically connected to the n-type semiconductor layer and the p-type semiconductor layer. The semiconductor layered body can include a nitride semiconductor ($In_xAl_yGa_{1-x-y}N$, $0 \leq x$, $0 \leq y$, $x+y \leq 1$) capable of emitting light in the ultraviolet to visible range.

The light-emitting element 21 can be an element that emits blue light, for example. The light-emitting elements 21 of the plurality of light-emitting modules 101 can include elements that emit light of different colors from each other. For example, the light-emitting elements 21 of the plurality of light-emitting modules 101 can include elements that emit red light, elements that emit blue light, and elements that emit green light. In the present embodiment, an LED that emits blue light is employed as an example of the light-emitting element 21.

The light-emitting element 21 as seen from above can typically have a rectangular shape. The length of each side of the rectangular shape of the light-emitting element 21 is 1000 μm or less, for example. The length along the x or y direction of the rectangular shape of the light-emitting element 21 can be 500 μm or less. Light-emitting elements whose length along the x or y direction is 500 μm or less can be produced at low cost. Alternatively, length along the x or y direction of the rectangular shape of the light-emitting element 21 can be 200 μm or less. In the case in which the light-emitting element 21 is applied to a backlight unit of a liquid crystal display device, the length of each side of the rectangular shape of the light-emitting element 21 is preferably small for rendering high-definition images and actuating local dimming, for example. Particularly, with a light-emitting element of which the length along the y direction and the length along the x direction are both 250 μm or less, the area of the upper surface is small. Accordingly, the amount of light emission from the lateral surface of the light-emitting element relatively becomes greater. Therefore, it is easy to obtain a batwing-shaped light distribution characteristic. A batwing-shaped light distribution characteristic generally refers to a light distribution characteristic that is defined as an emission intensity distribution such that the emission intensity is stronger at angles at which the absolute value of the light distribution angle is greater than 0°, where 0° is the optical axis that is perpendicular to the upper surface of the light-emitting element.

The light-emitting element 21 has an emission surface 21b and an electrode surface 21a located on the opposite side from the emission surface 21b, and includes the first electrode 21s and the second electrode 21t on the electrode surface 21a. The first electrode 21s and the second electrode 21t are electrically connected to the semiconductor layered body.

The light-transmitting member 22 is disposed on an emission surface 21b of the light-emitting element 21. The light-transmitting member 22 absorbs at least a portion of light emitted from the light-emitting element 21 and can output light of a different wavelength than the wavelength of the light from the light-emitting element 21. For example, the light-transmitting member 22 converts the wavelength of a portion of blue light from the light-emitting element 21 to output yellow light. With such a configuration, blue light that passes through the light-transmitting member 22 and yellow light that is emitted from the light-transmitting member 22 are mixed together, thereby obtaining white light. The light emitted from the light-emitting element 21 is basically introduced into the inside of the lightguide plate 10 through the light-transmitting member 22. Therefore, the mixed light is diffused inside the lightguide plate 10, and, for example, white light whose brightness non-uniformity is suppressed can be extracted from the second primary surface 10b of the lightguide plate 10. In this regard, using the light source 20 of the present embodiment is advantageous for the uniformity of the light as compared with diffusing light in the lightguide plate and then converting the wavelength thereof.

The light-transmitting member 22 preferably has a first primary surface 22a and a second primary surface 22b that are larger than the emission surface 21b of the light-emitting element 21. Then, the optical path of light that is emitted from the light-emitting element 21 and passes through the light-transmitting member 22 can be made long, thereby allowing for sufficient wavelength conversion. The second primary surface 22b of the light-transmitting member 22 also serves as the emitting surface 20b of the light source 20. The light-transmitting member can be formed so as to cover the lateral surface of the light-emitting element.

The light-transmitting member 22 is typically a member containing particles of a phosphor dispersed in a resin. The resin in which particles of a phosphor, or the like, are dispersed can be a silicone resin, a modified silicone resin, an epoxy resin, a modified epoxy resin, a urea resin, a phenol resin, an acrylic resin, a urethane resin or a fluorine resin, or a resin that includes two or more of these resins. Because the light-transmitting member 22 is adjacent to the light-emitting element 21, the light-transmitting member 22 preferably contains a silicone resin or a modified silicone resin, which is unlikely to be altered by ultraviolet rays.

In order to efficiently introduce light into the lightguide plate 10, the base material of the light-transmitting member 22 preferably has a lower refractive index than that of the material of the lightguide plate 10. The light-transmitting member 22 can be given the light diffusion function by dispersing a material having a different refractive index than that of the base material of the light-transmitting member 22. For example, particles of titanium oxide, silicon oxide, etc., can be dispersed in the base material of the light-transmitting member 22. The light-transmitting member 22 can be a layer that does not contain a phosphor. The light-transmitting member 22 can be a layered body. Each layer in the layered body can include a different phosphor, or the layers can include the same phosphor. In addition, the plurality of layers can include a light-reflecting film that includes a reflecting material. The light-transmitting member 22 can achieve a desired characteristic by appropriately combining these layers.

Known materials can be used as the phosphor. Examples of the phosphor include a YAG-based phosphor or a fluoride-based phosphor such as a KSF-based phosphor, a nitride-based phosphor such as CASN, and a β-SiAlON phosphor. A YAG-based phosphor is an example of a wavelength conversion substance that converts blue light into yellow light, a KSF-based phosphor and CASN is an example of a wavelength conversion substance that converts blue light into red light, and a β-SiAlON phosphor is an example of a wavelength conversion substance that converts blue light into green light. The phosphor can be a quantum dot phosphor.

It is not necessary that the phosphor contained in the light-transmitting member 22 be the same phosphor in the plurality of light-emitting modules 201. The phosphor dispersed in the base material of the light-transmitting member 22 can be different between different light-emitting modules 201.

The first joining member 23 is a light-transmitting member that covers at least a portion of the lateral surface of the light-emitting element 21 and a portion of the first primary surface 22a of the light-transmitting member 22, and joins together the light-transmitting member 22 and the light-emitting element 21. Although not shown in FIG. 5, the first joining member 23 can be located also between the light-emitting element 21 and the light-transmitting member 22.

The material of the first joining member 23 can be a resin composition that includes a transparent resin material as the base material. The first joining member 23 has a transmittance of 60% or more, for example, with respect to light having the emission peak wavelength the light-emitting element 21. In view of the effective use of light, the transmittance of the first joining member 23 at the emission peak wavelength of the light-emitting element 21 is preferably 70% or more, and more preferably 80% or more.

A typical example of the base material of the first joining member 23 is a thermosetting resin such as an epoxy resin or a silicone resin. The base material of the first joining member 23 can be a silicone resin, a silicone modified resin, an epoxy resin, a phenol resin, a polycarbonate resin, an acrylic resin, a polymethylpentene resin or a polynorbornene resin, or a material including two or more of these materials. The first joining member 23 typically, has a refractive index lower than the refractive index of the lightguide plate 10. The first joining member 23 can be given a light diffusion function by dispersing therein, a material having a different refractive index than that of the base material, for example.

As described above, the first joining member 23 covers at least a portion of the lateral surface of the light-emitting element 21. The first joining member 23 has an outer surface, which is the interface with the cover member 24 to be described later. Light that is emitted from the lateral surface of the light-emitting element 21 to enter the first joining member 23 is reflected, at the position of the outer surface of the first joining member 23, toward above the light-emitting element 21. The shape of the outer surface of the first joining member 23 as seen in a cross section is not limited to a straight line as shown in FIG. 5A, but can be a zigzag line, a curved line that protrudes toward the light-emitting element 21, a curved line that protrudes away from the light-emitting element 21, etc.

The cover member 24 is light-reflecting and is provided beside the light-emitting element 21 covering the lateral surface of the light-emitting element 21 and the first joining member 23. The cover member 24 covers a region of the first primary surface 22a of the light-transmitting member 22 that is not in contact with the light-emitting element 21 and the first joining member 23. The cover member 24 is provided also on the electrode surface 21a of the light-emitting element 21, and portions of the cover member 24, which are located beside the light-emitting element 21 and on the electrode surface 21a, surrounds the first electrode 21s and the second electrode 21t. The cover member 24 forms the electrode surface 20a of the light source 20, and the first electrode 21s and the second electrode 21t are exposed from the cover member 24 on the electrode surface 20a.

The cover member 24 contains a first resin to be the base material and a light-reflecting filler. The first resin can be a silicone resin, a phenol resin, an epoxy resin, a BT resin, a polyphthalamide (PPA), or the like. Alternatively, required characteristics may be achieved by using two or more of these resins. The cover member 24 covers a lateral surface 21c of the light-emitting element 21, and can be exposed to ultraviolet rays. Therefore, it is preferred that a resin that is unlikely to be altered by ultraviolet rays is used as the first resin. Specifically, among those resins, the first resin is preferably a thermosetting resin, and is preferably a silicone resin. There is no limitation to this example, and the cover member 24 can be of the same material as the light-transmitting member 22 described above.

The light-reflecting filler can be metal particles or particles of an inorganic or organic material having a higher refractive index than the first resin. Examples of the light-reflecting filler include particles of titanium oxide, silicon oxide, zirconium dioxide, potassium titanate, aluminum oxide, aluminum nitride, boron nitride, mullite, niobium oxide and barium sulfate, or particles of various rare earth oxides such as yttrium oxide and gadolinium oxide. The cover member 24 preferably has a white color.

[Second Joining Member 50]

The second joining member 50 is disposed in the first recess 11 so as to cover at least a portion of the lateral surface 20c of the light source 20 disposed in the first recess 11 of the light-emitting module 101. It is preferred that the light source 20 is disposed in the first recess 11 so that the optical axis of the light source 20 coincides with the center of the first recess 11 as seen from above. Because the center of the first recess 11 and the center of the second recess 12 coincide with each other as seen from above, the light source 20 also coincides with the center of the second recess 12, which has the optically functional part.

More specifically, the light source 20 is disposed in the first recess 11 so that the second primary surface 22b of the light-transmitting member 22, which is the light extraction surface of the light source 20, faces a bottom surface 11b of the first recess 11. The second joining member 50 covers at least a portion of the lateral surface 20c of the light source 20, and is provided in the space of the first recess 11 that is not occupied by the light source 20. There is no limitation to this example, and the second joining member 50 can be disposed so as to cover a portion of the first primary surface 10a outside the first recess 11. As the second joining member 50 is disposed so as to cover a portion of the first primary surface 10a outside the first recess 11, the light extraction efficiency can be increased.

In the embodiment shown in FIG. 4, the second joining member 50 covers the entire lateral surface 20c of the light source 20. However, portions of the lateral surfaces that are closer to the first electrode 21s and the second electrode 21t do not have to be not covered by the second joining member 50. In the present embodiment, an upper surface 50a of the second joining member 50 has a recess. However, the upper surface 50a can have a protruding portion. The upper surface 50a can be a flat surface.

The second joining member 50 is formed of a resin composition that contains a transparent resin material as the base material, as is the first joining member 23. The material of the second joining member 50 can be different from, or the same as, the material of the first joining member 23. The second joining member 50 typically has a lower refractive index than the refractive index of the lightguide plate 10.

[Light-Reflecting Member 30]

The light-reflecting member 30 is light reflective. The light-reflecting member 30 is provided on, and covers, the first primary surface 10a of the lightguide plate 10. Preferably, the light-reflecting member 30 is provided also on, and covers, the second joining member 50 located in the first recess 11 of the first primary surface 10a. Thus, the light-reflecting member 30 is provided around the light source 20 so that the electrode surface 20a of the light source 20 (i.e., the cover member 24, the first electrode 21s and the second electrode 21t) is exposed, and is provided on the lightguide plate 10. It is preferred that the first primary surface 30a of the light-reflecting member 30 has no step relative to the electrode surface 20a of the light source 20, and is coplanar with the electrode surface 20a.

With the light-reflecting member 30 covering the first primary surface 10a, light that is incident on the first primary surface 10a of the lightguide plate 10 is reflected toward the second primary surface 10b.

The light-reflecting member 30 contains a second resin to be the base material and a light-reflecting filler. The second resin can be a silicone resin, a phenol resin, an epoxy resin, a BT resin, a polyphthalamide (PPA), or the like. Required characteristics, such as hardness, can be realized by using two or more of these resins. The light-reflecting filler can be metal particles or particles of an inorganic or organic material having a higher refractive index than that of the first resin. Examples of the light-reflecting filler include particles of titanium oxide, silicon oxide, zirconium dioxide, potassium titanate, aluminum oxide, aluminum nitride, boron nitride, mullite, niobium oxide and barium sulfate, or particles of various rare earth oxides such as yttrium oxide and gadolinium oxide. The light-reflecting member 30 preferably has a white color.

Because the light-reflecting member 30 covers most of the first primary surface 10a of the lightguide plate 10, it is preferred that the strength of the lightguide plate 10 be reinforced by the light-reflecting member 30. Therefore, the second resin to be the base material preferably has a relatively high hardness. Specifically, the second resin preferably has a higher hardness than that of the first resin of the cover member 24.

[Support Layer 60]

The support layer 60 is disposed so as to cover the first primary surface 30a of the light-reflecting member 30 and the electrode surface 20a of the light source 20, and has a hole 60h through which the first electrode 21s and the second electrode 21t of the light source 20 are at least partially exposed. That is, the support layer 60 is in contact with, and covers, the light-reflecting member 30 and the cover member 24 of the light source 20. In order to increase the insulation, it is preferred that a region of the electrode surface 20a between the first electrode 21s and the second electrode 21t is also covered by the support layer 60. In other words, it is preferred that the hole 60h, through which the first electrode 21s is exposed, and the hole 60h, through which the second electrode 21t is exposed, are independent of each other.

The support layer 60 supports the wiring layer 70 to be described below. Therefore, it is preferred that the support layer 60 is formed of a relatively hard material. Specifically, the support layer 60 includes a third resin, and the third resin has a higher hardness than the first resin. The third resin can also have a higher hardness than that of the second resin. The third resin can be formed of an acrylic resin, an epoxy resin, a nylon, etc. The support layer 60 can include a primer resin, or the like, in addition to the third resin.

The support layer 60 has a thickness of about 5 μm or more and about 30 μm or less, for example. If the support layer 60 having a thickness of less than 5 μm is subjected to an external stress, the support layer 60 is likely to deform by a stress difference at the boundary between the light-reflecting member 30 and the cover member 24 because of the difference in hardness between the light-reflecting member 30 and the cover member 24, with which the support layer 60 is in contact, and disconnections are likely to occur on the wiring layer 70. In view of deformation, the support layer 60 is preferably thicker. However, if the thickness of the support layer 60 is excessively greater, the light-emitting module 201 as a whole becomes undesirably thick. Thus, the thickness of the support layer 60 is preferably about 30 μm or less.

[Wiring Layer 70]

The wiring layer 70 is disposed in contact with the support layer 60. The wiring layer 70 has a predetermined conductive wiring pattern, and is connected to the first electrode 21*s* and the second electrode 21*t* of the light-emitting element 21 through the holes 60*h* of the support layer 60. The wiring layer 70 of the light-emitting module 201 shown in FIG. 1C has a configuration in which eight series circuits are connected in parallel between a terminal 70A and a terminal 70C. Each of the series circuits includes two of the light-emitting modules 101 (each including at least one light source) disposed in four rows by four columns that are adjacent to each other in the Y direction. Therefore, in the light-emitting module 201, sixteen light-emitting modules 101 are driven simultaneously. The driving circuit formed by the wiring layer 70 is not limited to this example, and the driving circuit can be configured so that a plurality of light sources 20 included in the light-emitting module 201 are grouped into two or more groups, and the light sources 20 in each group are driven simultaneously. FIG. 3C shows the wiring layer 70 for one of the plurality of light-emitting modules 101. The wiring layer 70 in the light-emitting modules 101 can have different wiring patterns depending on the position of the light-emitting module 101.

Because the wiring layer 70 is disposed on the hard support layer 60, disconnections are unlikely to occur without forming the wiring layer 70 thick. For example, the thickness of the wiring layer 70 is about 1 µm or more and about 30 µm or less.

The wiring layer 70 can be a printed wiring produced by screen printing, inkjet printing, or the like, or can be a thin film wiring produced by a thin film formation technique using a vapor deposition method such as a sputtering method and a lithography method using a photoresist. In the case of using a printed wiring, the wiring layer 70 can be a single layer, for example. In the case of using a thin film wiring, the wiring layer 70 can be a layered body of two or more metal layers. The printed wiring can be formed by using a binder formed of a resin, a solvent, and a conductive paste that contains particles of copper, silver, or the like, for example. The thin film wiring can be a single layer or a layered body of a metal thin film or metal thin films of copper, nickel, tungsten, titanium, or the like.

[Insulative Layer 80]

The insulative layer 80 is provided at least on a region 60*m* of the support layer 60 between the first electrode 21*s* and the second electrode 21*t*. As long as the region 60*m* is included, the insulative layer 80 can cover the wiring layer 70 over a larger region or can cover a portion of the wiring layer 70. Thus, it is possible to suppress short-circuiting occurred for some reason, between the wire 70*s* of the wiring layer 70, which is connected to the first electrode 21*s*, and the wire 70*t* thereof, which is connected to the second electrode 21*t*. For example, the insulation between the wire 70*s* and the wire 70*t* may be reduced due to solder, dust, or the like, being inadvertently stuck thereto, when mounting the light-emitting module 201 on the lightguide plate that supplies electric power to the light-emitting module 201, for example. The insulative layer 80 may suppress lowering of the insulation. The insulative layer 80 can be formed of an insulative resin such as an epoxy resin, for example.

In the light-emitting module 201, a portion of the support layer 60 that supports the wiring layer 70 continuously covers the cover member 24 having a relatively low hardness and the light-reflecting member 30 having a relatively high hardness. Because the hardness of the support layer 60 is higher than the hardness of the cover member 24, when mounting the light-emitting module on the mounting lightguide plate that supplies electric power to the light-emitting module 201, it may reduce possibility of disconnections on the wiring layer due to the hardness difference at the boundary between the cover member 24 and the light-reflecting member 30. Therefore, the wiring layer 70 can be thin, and formed of a material that has a low strength as the wire material.

In the case in which there is no step between the surface of the cover member 24 and the surface of the light-reflecting member 30, and a single continuous plane is formed therebetween, the stress from the mounting lightguide plate is dispersed uniformly over the entire support layer 60, thereby better reducing the possibility of disconnections on the wiring layer 70.

Particularly, when ultraviolet rays are radiated from the light-emitting element 21, it is preferred that the light-transmitting member 22 and the cover member 24 covering the lateral surface of the light-emitting element 21 are unlikely to be altered by ultraviolet rays. Therefore, the first resin included in the cover member 24 and the resin included in the light-transmitting member 22 are preferably a silicone resin, which is unlikely to be altered by ultraviolet rays. In this case, however, because a silicone resin typically has a low hardness, and this occurs a great difference between a displacement amount of a portion of the wiring layer 70 on the cover member 24 and a displacement amount of a portion of the wiring layer 70 on the light-reflecting member 30 due to the hardness difference between the members supporting the wiring layer 70 and after receiving a stress. With the light-emitting module 201, the wiring layer 70 is formed on the support layer 60, and the support layer 60 may reduce displacement due to stress. Therefore, with the light-emitting module 201, it is possible to reduce situations such as the possibility of disconnections occurring when mounting the light-emitting module 201, thus realizing a high reliability.

(Method of Manufacturing Light-Emitting Module 201)

Referring to FIG. 6 and FIG. 7A to FIG. 7H, an example embodiment of a method of manufacturing the light-emitting module 201 will be described. A method of manufacturing the light-emitting module 201 includes the steps of: (A) disposing a plurality of light sources; (B) forming a light-reflecting member; (C) forming a support layer; (D) exposing a first electrode and a second electrode; (E) forming a wiring layer; and (F) forming an insulative layer. These steps will now be described in detail.

(A) Step of Disposing a Plurality of Light Sources

A lightguide plate 10' is provided. The lightguide plate 10' is a block of substrate including an integral array of a plurality of lightguide plates 10 of the light-emitting module 201. In the example shown in FIG. 6, the lightguide plates 10 are disposed in two rows by three columns. Because a plurality of lightguide plates 10 are joined together, it is possible to simultaneously manufacture a plurality of light-emitting modules 201. The number of lightguide plates 10 included in the lightguide plate 10' is not limited to the example shown in FIG. 6, but can be a number other than six. The lightguide plate 10' can be one lightguide plate 10.

Figure 7A:
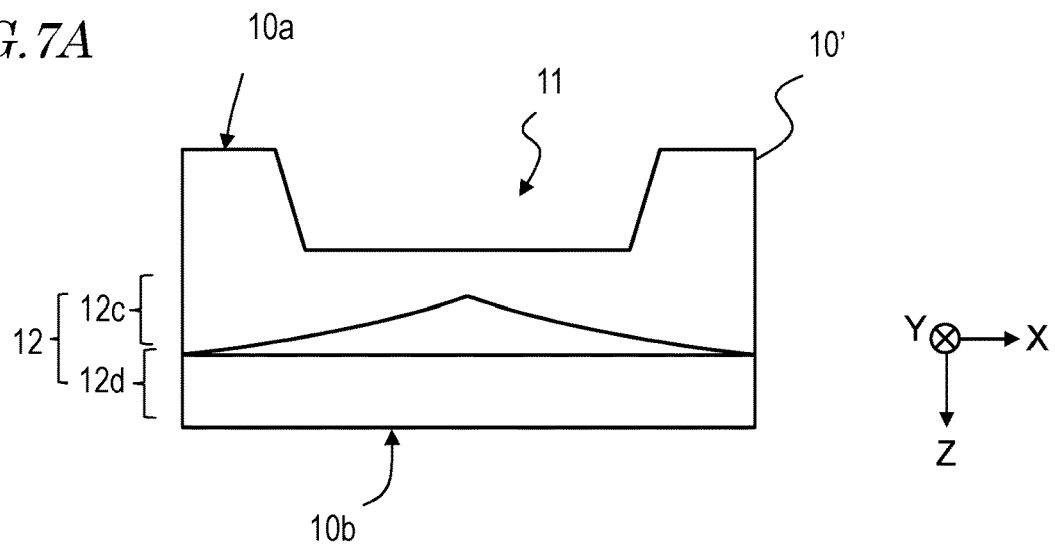
FIG. 7A is a cross-sectional view showing a step of the method of manufacturing a light-emitting module according to one embodiment.

As shown in FIG. 7A, the lightguide plate 10' includes a plurality of first recesses 11 provided on the first primary surface 10*a* and a plurality of second recesses 12 provided on the second primary surface 10*b*. The lightguide plate 10' having such a shape can be formed by, for example, injection molding. There is no limitation to this example, and the lightguide plate 10' can be provided through purchase or can be provided by forming recesses on a flat plate-shaped material.

Figure 7B:
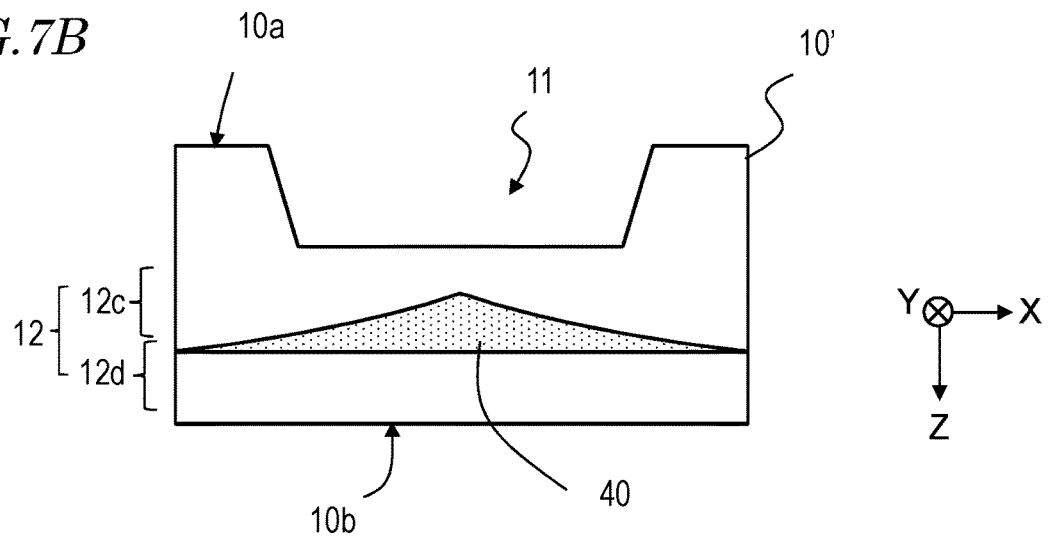
FIG. 7B is a cross-sectional view showing a step of the method of manufacturing a light-emitting module according to one embodiment.

Subsequently, as shown in FIG. 7B, the light-reflecting layer 40 is formed in each second recess 12 of the lightguide plate 10'. The light-reflecting layer 40 can be formed by, for example, disposing and curing the material of the light-reflecting layer 40 in the first portion 12c of the second recess 12 by way of printing by an inkjet method, potting, etc. The light-reflecting layer 40 can be formed in other steps than the above example, for instance, after the step of (F) forming an insulative layer to be described below.

Figure 7C:
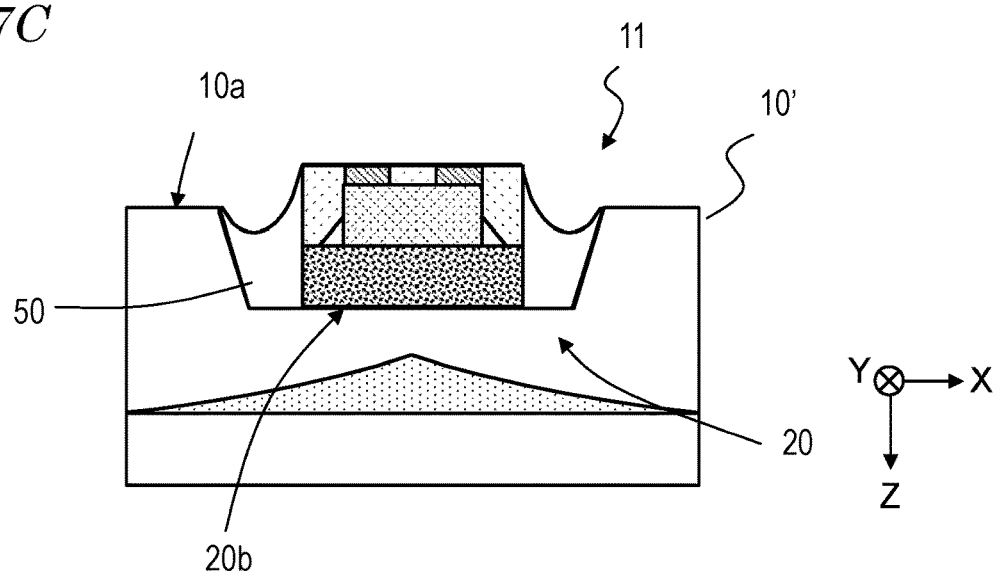
FIG. 7C is a cross-sectional view showing a step of the method of manufacturing a light-emitting module according to one embodiment.

Subsequently, as shown in FIG. 7C, a plurality of light sources 20 are disposed on the first primary surface 10a of the lightguide plate 10'. Specifically, a dispenser, or the like, is used to dispense the material of the second joining member 50 into the first recesses 11 of the lightguide plate 10'. Then, the light sources 20 are disposed in the first recesses 11 so that the emitting surfaces 20b face the lightguide plate 10', and the material of the second joining member 50 is cured.

For example (see FIG. 5A), the light sources 20 are produced as follows. A plurality of light-emitting elements 21 are disposed in a two-dimensional array, by using the material of the first joining member 23, on an block of substrate of the light-transmitting member 22, and the material of the first joining member 23 is cured, thereafter the material of the cover member 24 is provided on the block of substrate so as to cover the electrode surfaces 21a, thereby filling the gap between the light-emitting elements 21 disposed in an array. After curing the material of the cover member 24, a portion of the cover member 24 is removed by polishing, sand blasting, etc., so that the first electrode 21s and the second electrode 21t of the electrode surface 21a are exposed. Thereafter, the block of substrate is divided into individual pieces, thus obtaining the light sources 20. Light sources can be prepared by purchasing various light sources.

(B) Step of Forming Light-Reflecting Member

Figure 7D:
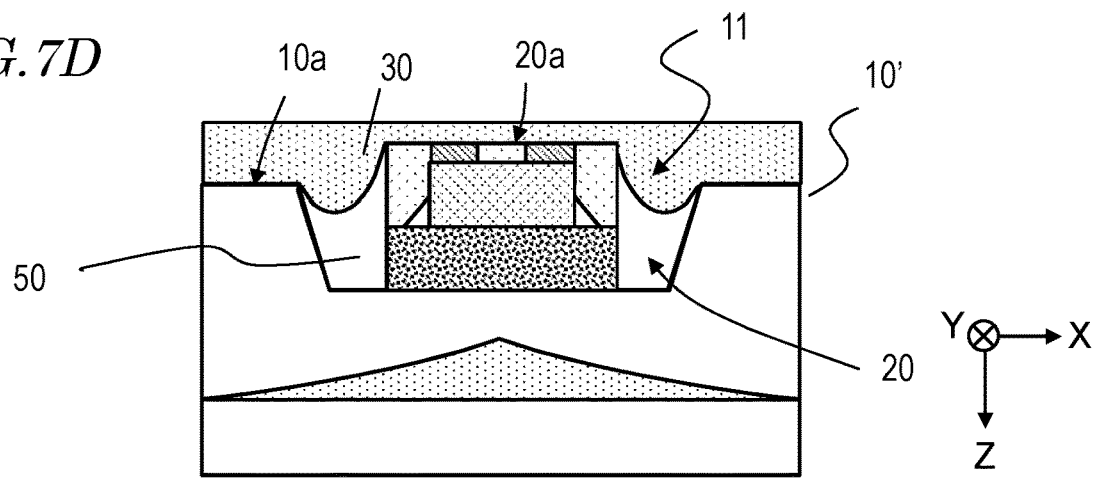
FIG. 7D is a cross-sectional view showing a step of the method of manufacturing a light-emitting module according to one embodiment.

As shown in FIG. 7D, the light-reflecting member 30 is provided around the light sources 20. The material of the light-reflecting member 30 is provided on the first primary surface 10a of the lightguide plate 10'. It is preferred that the material of the light-reflecting member 30 is provided also in the first recesses 11 of the first primary surface 10a. Specifically, a dispenser, or the like, is used to dispense the material of the light-reflecting member 30 onto the first primary surface 10a of the lightguide plate 10' so as to cover the second joining members 50 in the first recesses 11 and the electrode surfaces 20a of the light sources 20. The material of the light-reflecting member 30 is flattened by a roller, or the like, and then cured.

Figure 7E:
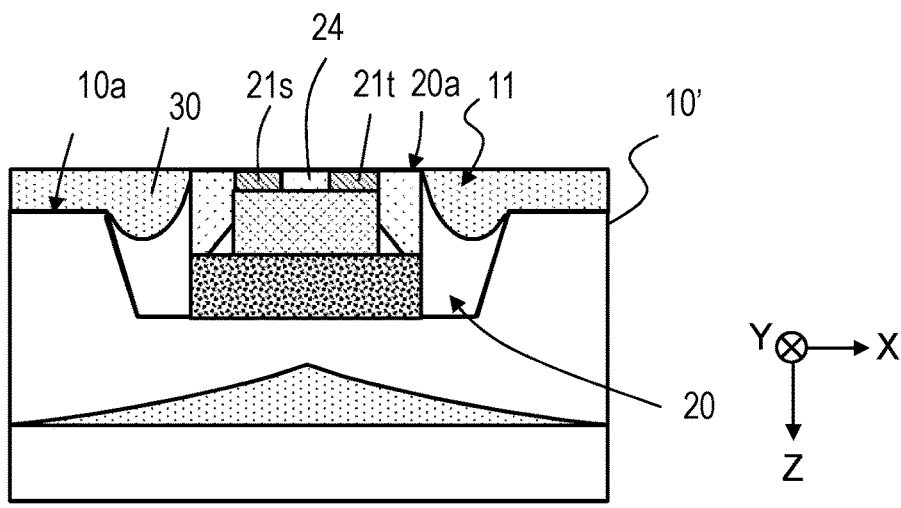
FIG. 7E is a cross-sectional view showing a step of the method of manufacturing a light-emitting module according to one embodiment.

Thereafter, a portion of the cured light-reflecting member 30 is removed from the upper surface by polishing, sand blasting, etc., so that at least part of the first electrode 21s and at least part of the second electrode 21t of the light source 20 are exposed as shown in FIG. 7E. In this process, the cover members 24 of the light sources 20 are exposed at the same time. In the case in which the first joining members 23 are exposed at the same time, the configuration in which the wiring layer 70 is disposed on the support layer 60 can reduce the possibility of disconnections on the wiring layer 70 due to stress from the mounting lightguide plate.

(C) Step of Forming Support Layer

Figure 7F:
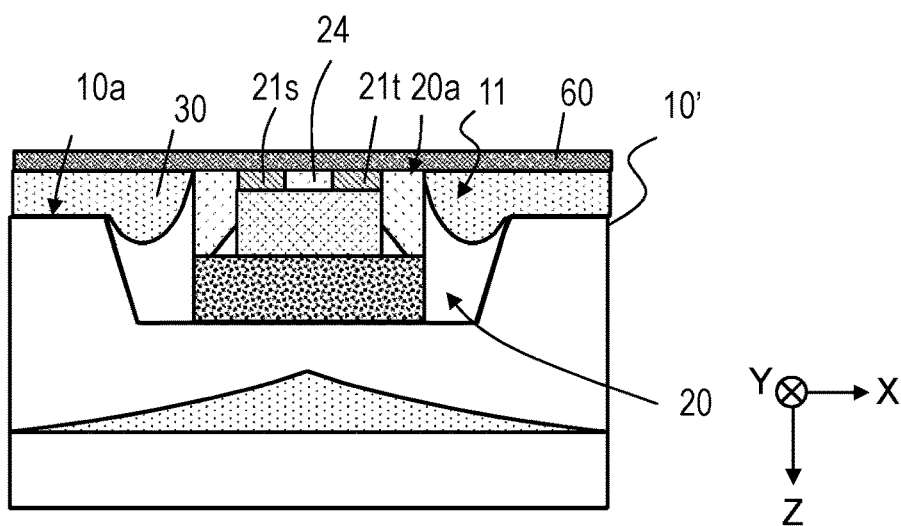
FIG. 7F is a cross-sectional view showing a step of the method of manufacturing a light-emitting module according to one embodiment.

As shown in FIG. 7F, the support layer 60 is formed on the light-reflecting member 30 and the electrode surfaces 20a of the light sources 20 exposed through the light-reflecting member 30. Specifically, the material of the support layer 60 is formed on the light-reflecting member 30, the cover members 24 located on the electrode surfaces 20a of the light sources 20 and the first electrodes 21s and the second electrodes 21t, by way of a spray method such as an impact pulse method, application, dripping with a dispenser, or the like, for example. Thereafter, the material of the support layer 60 is cured.

(D) Step of Exposing First Electrode and Second Electrode

Figure 7G:
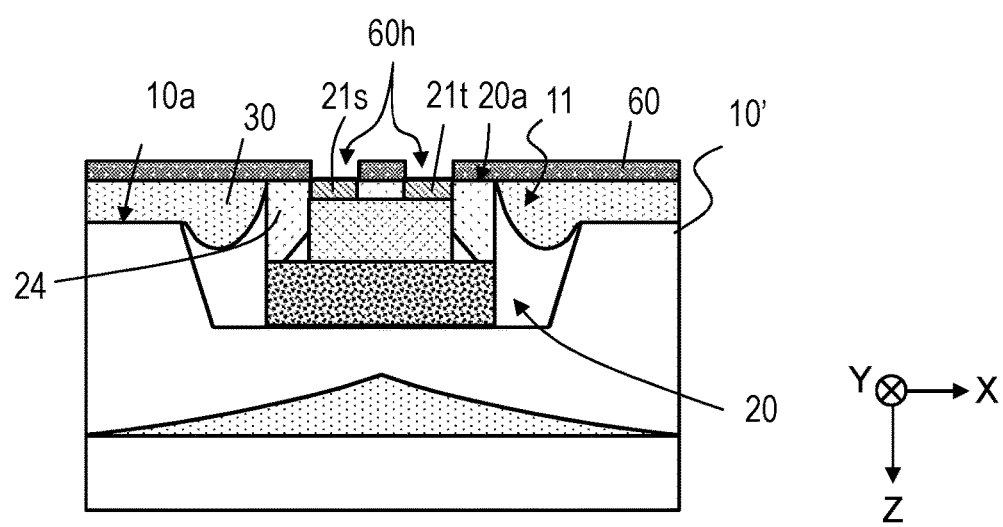
FIG. 7G is a cross-sectional view showing a step of the method of manufacturing a light-emitting module according to one embodiment.

As shown in FIG. 7G, portions of the support layer 60 is removed to expose the first electrode 21s and the second electrode 21t. For example, portions of the support layer 60 that are located on the first electrode 21s and the second electrode 21t are removed by using a laser to form the hole 60h so that at least part of the first electrode 21s and at least part of the second electrode 21t are exposed through the hole 60h.

(E) Step of Forming Wiring Layer

Figure 7H:
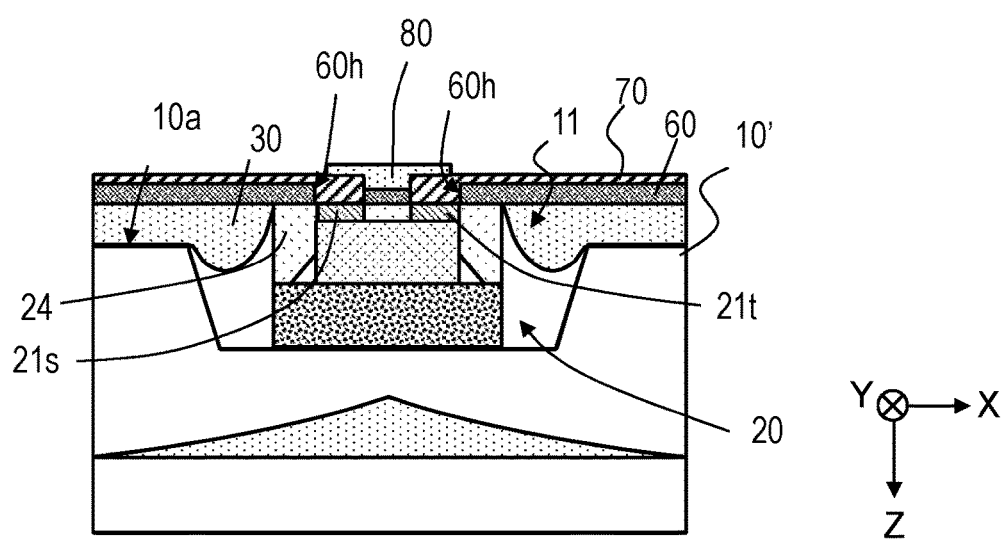
FIG. 7H is a cross-sectional view showing a step of the method of manufacturing a light-emitting module according to one embodiment.

As shown in FIG. 7H, the wiring layer 70 is formed on the support layer 60 and the first electrodes 21s and the second electrodes 21t of the light sources 20. For example, a conductive paste to be the wiring layer 70 is used to form a predetermined circuit pattern on the support layer 60 by a screen printing method, or the like. In this process, portions of the circuit pattern are formed also on the first electrodes 21s and the second electrodes 21t exposed through the holes 60h of the support layer 60. Thereafter, solvent is removed from the paste by heat, or the like, thereby forming the wiring layer 70.

(F) Step of Forming Insulative Layer

As necessary, the insulative layer 80 is formed on a region of the support layer 60 between the first electrode 21s and the second electrode 21t. For example, a potting method, or the like is used to form the insulative layer 80 on a region of the support layer 60 between the first electrode 21s and the second electrode 21t. The insulative layer can further cover other regions of the support layer 60, and can cover portions of the wiring layer 70. Thus, the light-emitting module 201 is completed.

(G) Cutting Step

In the case in which the lightguide plate 10' includes a plurality of regions of lightguide plates 10, the layered body including the lightguide plate 10' is cut. For example, the layered body is cut into pieces each having the size of the lightguide plate 10 by using a lightguide plate cutting apparatus including a linear blade, a rotary round blade, or the like. Thus, individual light-emitting modules 201 are obtained.

(Other Embodiments)

The light-emitting module of the present disclosure is not limited to the embodiment described above, and various modifications can be made thereto. For example, the number of light-emitting modules is not limited to the embodiment described above, and the light-emitting module do not necessarily have the second recess, or do not necessarily have the light-reflecting layer in the second recess.

Figure 8A:
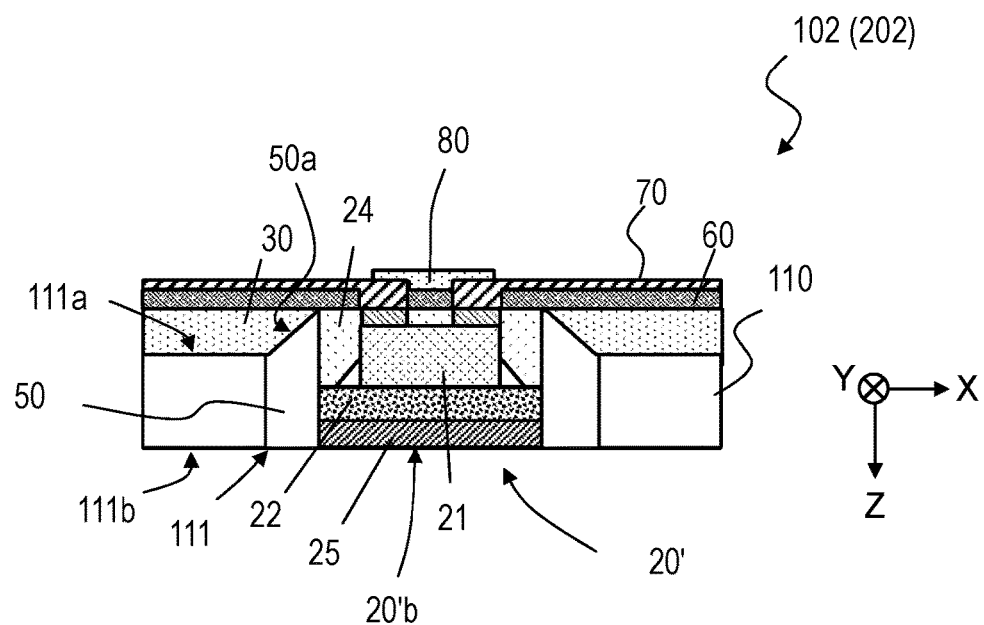
FIG. 8A is a cross-sectional view showing a main part of a light-emitting module according to another embodiment.

In the embodiment described above, the lightguide plate 10, 10' includes the first recesses 11. However, a light-emitting module of the present disclosure can be configured by using a lightguide plate having through holes. FIG. 8A is a cross-sectional view showing a main part of a light-emitting module 102 of a light-emitting module 202.

The light-emitting module 202 and the light-emitting module 102 are different from the light-emitting module 201 and the light-emitting module 101 in that they include a lightguide plate 110 having a plurality of holes 111, instead of the first recesses 11, and light sources 20' disposed in the holes 111.

The light-emitting modules 102 of the light-emitting module 202 include the lightguide plate 110 having the holes 111. The holes 111 are through holes, each forming an opening on the first primary surface 110a of the lightguide plate 110 and forming an opening on the second primary surface 110b thereof located on the opposite side from the first primary surface 110a. The lightguide plate 110 may or may not include the curved surface portion 10c as shown in FIG. 3A on the first primary surface 110a. In the case in which the lightguide plate 110 does not include the curved surface portion 10c, the lightguide plate 110 can be produced by forming the holes 111 in the lightguide plate 110 having a flat first primary surface 110a and a flat second primary surface 110b, and it is possible to reduce the manufacturing cost.

The light source 20' is disposed in the hole 111, and is supported on the lightguide plate 110 by the second joining member 50. In the embodiment shown in FIG. 8A, the height of the light source 20' is greater than the thickness of the lightguide plate 110 (the interval between the first primary surface 110a and the second primary surface 110b), and the light source 20' partly protrudes out of the hole 111.

In the present embodiment, the light source 20' further includes a light-reflecting film 25 disposed on the second primary surface 22b of the light-transmitting member 22. The light-reflecting film 25 contains a light-reflecting substance, and can be formed by using a material similar to that of the light-reflecting layer 40, for example. Providing the light-reflecting film 25 can allow light emitted from the light-emitting element 21 to efficiently enter the lightguide plate 110.

Figure 8B:
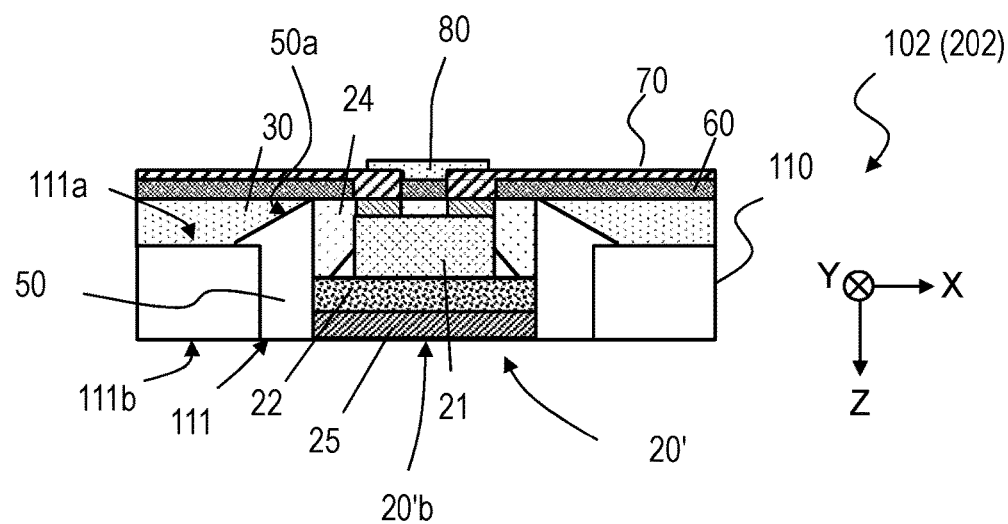
FIG. 8B is a cross-sectional view showing a main part of a light-emitting module according to another embodiment.

The second joining member 50 is provided between the inner surface of the lightguide plate 110 defined by the hole 111 and the lateral surface of the light source 20', and fixes the light source 20' to the lightguide plate 110. While the second joining member 50 is absent outer of the hole 111 in the embodiment shown in FIG. 8A, a portion of the second joining member 50 can be provided also outward of the hole 111 of the first primary surface 111a as shown in FIG. 8B. While the upper surface 50a of the second joining member 50 is a flat surface in the embodiment shown in FIG. 8A and FIG. 8B, the upper surface 50a can have a protruding portion or can have a recess.

It is preferred that an emitting surface 20'b of the light source 20' is coplanar with the second primary surface 110b of the lightguide plate 110.

Figure 9A:
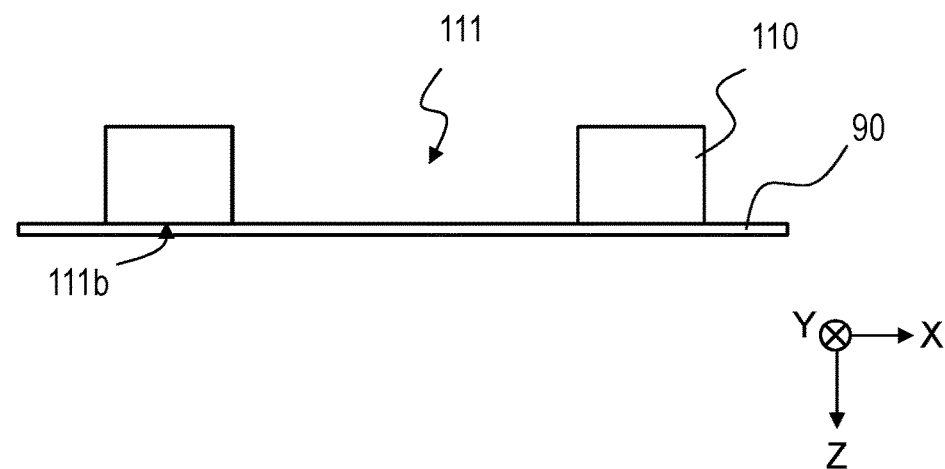
FIG. 9A is a cross-sectional view showing a step of a method of manufacturing the light-emitting module according to one embodiment of FIG. 8A.
Figure 9B:
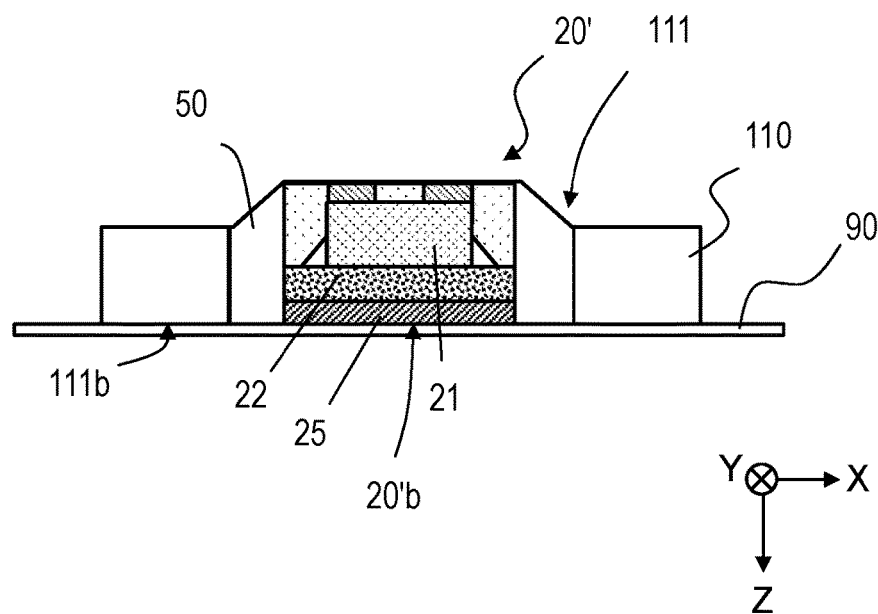
FIG. 9B is a cross-sectional view showing a step of the method of manufacturing the light-emitting module according to one embodiment of FIG. 8A.

The light-emitting module 202 can be manufactured by using the lightguide plate 110 with an adhesive sheet 90 provided on the second primary surface 110b thereof, as shown in FIG. 9A, for example. Providing the adhesive sheet 90 can close the opening of the hole 111 on the second primary surface 111b, and the hole 111 of the lightguide plate 110 can be used as a recess with a bottom. Thus, the light-emitting module 202 can be produced by the same as or a similar to the steps described in the embodiment above. For example, as shown in FIG. 9B, a plurality of light sources 20' are disposed in the holes 111 of the lightguide plate 110. Specifically, a dispenser, or the like, is used to dispense the material of the second joining member 50 into the holes 111 of the lightguide plate 10', one side of which is closed by the adhesive sheet 90. Thereafter, the light sources 20' are disposed in the holes 111 so that the emitting surfaces 20'b oppose the adhesive sheet 90 in the holes 111, and the material of the second joining member 50 is cured.

Thus, the emitting surface 20'b of the light source 20', the second joining member 50 around the light source 20' and the second primary surface 110b of the lightguide plate 110 can be coplanar with each other. Thereafter, the light-emitting module 202 is produced by using the steps described above with reference to FIG. 7D to FIG. 7H, and the adhesive sheet 90 is finally removed, thereby completing the light-emitting module 202.

The light-emitting module 202 can obtain advantageous effects similar to those of the light-emitting module 201 described above, for example, reducing the possibility of disconnections of the wiring layer when mounting the module on the mounting substrate.

The embodiment of the present disclosure is useful in surface light sources of various applications. Particularly, the embodiment of the present disclosure is advantageously applicable to backlight units for liquid crystal display devices. The light-emitting module or the surface light source according to the embodiment of the present disclosure can suitably be used in backlights for display devices of mobile devices, for which there are strong demands for reducing the thickness, surface-emitting modules that are capable of local dimming, etc.

While exemplary embodiments of the present disclosure have been described, it is understood that the words that have been used are words of description and illustration, rather than words of limitation. The present disclosure can be modified in numerous ways and can assume many embodiments other than those specifically described above. Accordingly, the appended claims are intended to cover all modifications, enhancements, and other embodiments of the present disclosure that fall within the spirit and scope of the invention.

What is claimed is:
1. A light-emitting module comprising:
a lightguide plate configured to be light transmissive;
a plurality of light sources disposed on the lightguide plate, the light sources each having an emission surface, an electrode surface located on an opposite side from the emission surface, and a lateral surface, the emission surface being located closer to the lightguide plate than is the electrode surface, the plurality of light sources each comprising,
  a light-emitting element including a first electrode and a second electrode located on the electrode surface, and
  a cover member including a first resin and provided beside a lateral surface of the light-emitting element while the first electrode and the second electrode are exposed through the cover member;
a light-reflecting member provided on the lightguide plate and provided around the light sources while the cover members of the light sources are exposed through the light-reflecting member, the light-reflecting member including a second resin having a higher hardness than a hardness of the first resin;
a support layer covering the light-reflecting member and the cover members of the light sources while the first electrodes and the second electrodes of the light sources are exposed through the support layer, the support layer including a third resin having a higher hardness than a hardness of the first resin; and
a wiring layer provided on the support layer and connected to the first electrodes and the second electrodes of the light sources, wherein the cover member is light-reflecting and contacts at least a portion of the lateral surface of the light-emitting element, and wherein the topmost portion of the light-reflecting member is lower than the top surface of the light-emitting element.

2. The light-emitting module according to claim 1, wherein the lightguide plate includes:
a first primary surface and a second primary surface located on an opposite side from the first primary surface; and
a plurality of recesses on the first primary surface,
wherein at least one of the light sources is disposed in the recesses.

3. The light-emitting module according to claim 2, further comprising a joining member provided around the light source in each of the recesses.

4. The light-emitting module according to claim 1, wherein the lightguide plate includes:
a first primary surface and a second primary surface located on an opposite side from the first primary surface; and
a plurality of holes each having an opening on the first primary surface and an opening on the second primary surface,
wherein at least one of the light sources is disposed in the holes.

5. The light-emitting module according to claim 4, further comprising a joining member provided around the light source in each of the holes.

6. The light-emitting module according to claim 2, wherein the light-reflecting member is provided on the first primary surface of the lightguide plate.

7. The light-emitting module according to claim 1, further comprising an insulative layer provided on at least a region of the support layer between the first electrode and the second electrode of each light source.

8. The light-emitting module according to claim 1, wherein the first resin comprises a silicone resin, and the third resin comprises an acrylic resin.

9. The light-emitting module according to claim 1, wherein each of the light sources further includes a light-transmitting member provided so as to face the emission surface of the light-emitting element.

10. The light-emitting module according to claim 1, wherein on the electrode surface, the support layer further covers a region between the first electrode and the second electrode.

11. A method of manufacturing a light-emitting module, the method comprising:
disposing a plurality of light sources on a first primary surface of a light-transmitting lightguide plate located on an opposite side from the second primary surface of the lightguide plate, each of the light sources having an emission surface facing the lightguide plate, an electrode surface located on an opposite side from the emission surface, and a lateral surface, each of the light sources comprising,
a light-emitting element including a first electrode and a second electrode located on the electrode surface, and
a cover member including a first resin and provided beside a lateral surface of the light-emitting element while the first electrode and the second electrode are exposed through the cover member;
providing a light-reflecting member around the light sources on the first primary surface of the lightguide plate while the first electrodes, the second electrodes and the cover members of the light sources are exposed through the light-reflecting member, wherein the light-reflecting member including a second resin having a higher hardness than a hardness of the first resin;
forming a support layer on the light-reflecting member, the cover members, the first electrodes and the second electrodes, wherein the support layer including a third resin having a higher hardness than the first resin;
exposing the first electrodes and the second electrodes of the light sources by removing a portion of the support layer; and
forming a wiring layer on the support layer, the first electrodes and the second electrodes of the light sources,
wherein the cover member is light-reflecting and contacts at least a portion of the lateral surface of the light-emitting element, and
wherein the topmost portion of the light-reflecting member is lower than the top surface of the light-emitting element.

12. The method of manufacturing a light-emitting module according to claim 11, wherein:
the lightguide plate includes a plurality of recesses on the first primary surface; and
the step of disposing the light sources includes:
disposing each of the light sources in one of the recesses; and
providing a joining member around the light sources in the recesses.

13. The method of manufacturing a light-emitting module according to claim 11, wherein:
the lightguide plate includes a first primary surface and a second primary surface located on an opposite side from the first primary surface, and a plurality of holes each having an opening on the first primary surface and an opening on the second primary surface; and
the step of disposing the light sources includes:
disposing at least one of the light sources in the holes; and
providing a joining member around the light sources in the holes.

14. The method of manufacturing a light-emitting module according to claim 11, further comprising, after the step of forming the wiring layer, forming an insulative layer on at least regions of the support layer between the first electrodes and the second electrodes of the light sources.

15. The method of manufacturing a light-emitting module according to claim 11, wherein the step of forming the light-reflecting member includes:
forming the light-reflecting member on the first primary surface and on the first electrodes, the second electrodes and the cover member of the light sources;
flattening upper surfaces of the cover members;
grinding an upper surface of the light-reflecting member so that the first electrodes and the second electrodes of the light sources are exposed.

16. The method of manufacturing a light-emitting module according to claim 11, wherein the step of exposing the first electrodes and the second electrodes includes removing a portion of the support layer by a laser.

17. The method of manufacturing a light-emitting module according to claim 11, wherein the first resin includes a silicone resin, and the second resin includes an acrylic resin.

18. The method of manufacturing a light-emitting module according to claim 11, wherein on the electrode surface, the support layer further covers regions between the first electrodes and the second electrodes.

\* \* \* \* \*